(12) United States Patent
Kobayashi et al.

(10) Patent No.: US 8,570,065 B2
(45) Date of Patent: Oct. 29, 2013

(54) PROGRAMMABLE LSI

(75) Inventors: Hidetomo Kobayashi, Isehara (JP); Masami Endo, Isehara (JP); Yutaka Shionoiri, Isehara (JP); Hiroki Dembo, Isehara (JP); Tatsuji Nishijima, Hadano (JP); Kazuaki Ohshima, Isehara (JP); Seiichi Yoneda, Atsugi (JP); Jun Koyama, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/437,961

(22) Filed: Apr. 3, 2012

(65) Prior Publication Data

US 2012/0268164 A1    Oct. 25, 2012

(30) Foreign Application Priority Data

Apr. 13, 2011    (JP) .................................. 2011-088976

(51) Int. Cl.
*H03K 19/177* (2006.01)
*G11C 11/24* (2006.01)
(52) U.S. Cl.
USPC ................. 326/40; 326/38; 326/39; 365/149; 365/185.08; 365/189.05
(58) Field of Classification Search
USPC ................. 365/149, 185.08, 189.11, 189.05, 365/185.33; 326/38–41
See application file for complete search history.

(56) References Cited

U.S. PATENT DOCUMENTS

| 5,731,856 | A | 3/1998 | Kim et al. |
| 5,744,864 | A | 4/1998 | Cillessen et al. |
| 6,127,702 | A | 10/2000 | Yamazaki et al. |
| 6,172,521 | B1 * | 1/2001 | Motomura ..................... 326/40 |

(Continued)

FOREIGN PATENT DOCUMENTS

| EP | 1737044 A | 12/2006 |
| EP | 2226847 A | 9/2010 |

(Continued)

OTHER PUBLICATIONS

Kamiya et al., "Carrier transport properties and electronic structures of amorphous oxide semiconductors: the present status," Solid State Physics, Sep. 1, 2009, vol. 44, No. 9, pp. 621-633, Agne Gijutsu Center.

(Continued)

*Primary Examiner* — Vibol Tan
(74) *Attorney, Agent, or Firm* — Eric J. Robinson; Robinson Intellectual Property Law Office, P.C.

(57) ABSTRACT

A low-power programmable LSI that can perform dynamic configuration is provided. The programmable LSI includes a plurality of logic elements. The plurality of logic elements each include a configuration memory. Each of the plurality of logic elements performs different arithmetic processing and changes an electrical connection between the logic elements, in accordance with the configuration data stored in the configuration memory. The configuration memory includes a set of a volatile storage circuit and a nonvolatile storage circuit. The nonvolatile storage circuit includes a transistor whose channel is formed in an oxide semiconductor layer and a capacitor whose one of a pair of electrodes is electrically connected to a node that is set in a floating state when the transistor is turned off.

15 Claims, 19 Drawing Sheets

(56) References Cited

U.S. PATENT DOCUMENTS

| | | | |
|---|---|---|---|
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,477,072 B1 * | 1/2009 | Kao et al. | 326/41 |
| 7,501,293 B2 | 3/2009 | Ito et al. | |
| 7,559,011 B1 * | 7/2009 | Edwards | 714/811 |
| 7,626,861 B1 * | 12/2009 | Lakkapragada et al. | 365/185.08 |
| 7,674,650 B2 | 3/2010 | Akimoto et al. | |
| 7,732,819 B2 | 6/2010 | Akimoto et al. | |
| 8,145,923 B2 * | 3/2012 | Lakkapragada et al. | 713/320 |
| 8,319,267 B2 * | 11/2012 | Kato et al. | 257/315 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0210731 A1 * | 8/2009 | Lakkapragada et al. | 713/320 |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0148171 A1 | 6/2010 | Hayashi et al. | |
| 2011/0121878 A1 * | 5/2011 | Kato et al. | 327/215 |
| 2011/0175646 A1 | 7/2011 | Takemura et al. | |
| 2012/0212995 A1 | 8/2012 | Kurokawa | |
| 2012/0256653 A1 * | 10/2012 | Cordero et al. | 326/16 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-077319 A | 3/1994 |
| JP | 08-264794 A | 10/1996 |
| JP | 10-285014 A | 10/1998 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2010-166255 A | 7/2010 |
| WO | WO-2004/114391 | 12/2004 |

OTHER PUBLICATIONS

Jeon.S et al., "180nm Gate Length Amorphous InGaZnO Thin Film Transistor for High Density Image Sensor Applications," IEDM 10: Technical Digest of International Electron Devices Meeting, Dec. 6, 2010, pp. 504-507.

Ihun Song et al., "Short Channel Characteristics of Gallium—Indium—Zinc—Oxide Thin Film Transistors for Three-Dimensional Stacking Memory," IEEE Electron Device Letters, vol. 29, No. 6, Jun. 2008, pp. 549-552.

Ishii.T et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.

Kim.W et al., "An Experimental High-Density DRAM Cell with a Built-in Gain Stage," IEEE Journal of Solid-State Circuits, Aug. 1, 1994, vol. 29, No. 8, pp. 978-981.

Shukuri.S et al., "A Complementary Gain Cell Technology for sub-1 V Supply DRAMs," IEDM 92: Technical Digest of International Electron Devices Meeting, Dec. 13, 1992, pp. 1006-1008.

(56) References Cited

OTHER PUBLICATIONS

Shukuri.S et al., "A Semi-Static Complementary Gain Cell Technology for Sub-1 V Supply DRAM's," IEEE Transactions on Electron Devices, Jun. 1, 1994, vol. 41, No. 6, pp. 926-931.

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04: SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08: Proceedings of the 15th International Display Workshops, Dec. 3, 2008, pp. 1637-1640.

Hayashi.R et al., "42.1: Invited Paper: Improved Amorphous In-Ga-Zn-0 TFTS,", SID Digest '08: SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$-$Ga_2ZnO_4$-ZnO system at 1350° C,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$-$ZnGa_2O_4$-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of SOL-GEL-Derived Zinc Oxide Films by Irradiation with Ultraviolet Lamp,", Journal of SOL-GEL Science and Technology, 2003, vol. 26, pp. 181-184.

Osada.T et al., "15.2: Development of Driver-Integrated Panel using Amorphous In-Ga-Zn-Oxide TFT,", SID Digest '09: SID International Symposium Digest of Technical Papers, May 31, 2009, pp. 184-187.

Nomura.K at al., "Carrier transport in transparent oxide semiconductor with intrinsic structural randomness probed using single-crystalline $InGaO_3(ZnO)_5$ films,", Appl. Phys. Lett. (Applied Physics Letters), Sep. 13, 2004, vol. 85, No. 11, pp. 1993-1995.

Li.C et al. "Modulated Structures of Homologous Compounds $InMO_3(ZnO)_m$ (M=In, Ga: m=Integer) Described by Four-Dimensional Superspace Group.", Journal of Solid State Chemistry, 1998, vol. 139, pp. 347-355.

Son.K et al., "42.4L: Late-News Paper: 4 Inch QVGA Amoled Driven by the Threshold Voltage Controlled Amorphous GIZO ($Ga_2O_3$-$In_2O_3$-ZnO) TFT,", SID Digest '08: SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08: SID International Symposium Digest of Technical Papers, May 20, 2008, vol. 39, pp. 625-628.

Nowatari.H at al., "60.2: Intermediate Connector With Suppressed Voltage Loss for White Tandem OLEDS,", SID Digest '09: SID International Symposium Digest of Technical Papers, May 31, 2009, vol. 40, pp. 899-902.

Kanno.H et al., "White Stacked Electrophosphorecent Organic Light-Emitting Devices Employing $MOO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDS.", IDW'02: Proceedings of the 9th International Display Workshops, Dec. 4, 2002, pp. 295-298.

Van de Walle.C. "Hydrogen as a Cause of Doping in Zinc Oxide,", Phys. Rev. Lett. (Physical Review Letters). Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08: SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition: The "Blue Phase",", Physics Letters, Sep. 10, 1973, vol. 45A, No. 2, pp. 115-116.

Cho.D at al., "21.2:AL and SN-Doped Zinc Indium Oxide Thin Film Transistors for AMOLED Back-Plane,",SID Digest '09: SID International Symposium Digest of Technical Papers, May 31, 2009, pp. 280-283.

Lee.M et al., "15.4: Excellent Performance of Indium-Oxide-Based Thin-Film Transistors by DC Sputtering,", SID Digest '09: SID International Symposium Digest of Technical Papers, May 31, 2009, pp. 191-193.

Jin.D et al., "65.2: Distinguished Paper: World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTs,", IDW '09: Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZNO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3: Invited Paper: Transparent Amorphous Oxide Semiconductors for High Performance TFT,", SID Digest '07: SID International Symposium Digest of Technical Papers, 2007, vol. 38, pp. 1830-1833.

(56) References Cited

OTHER PUBLICATIONS

Godo.H et al., "P-9: Numerical Analysis on Temperature Dependence of Characteristics of Amorphous In-Ga-Zn-Oxide TFT,", SID Digest '09: SID International Symposium Digest of Technical Papers, May 31, 2009, pp. 1110-1112.

Ohara.H et al., "21.3: 4.0 In. QVGA AMOLED Display Using In-Ga-Zn-Oxide Tfts with a Novel Passivation Layer,", SID Digest '09: SID International Symposium Digest of Technical Papers, May 31, 2009, pp. 284-287.

Miyasaka.M, "Suftla Flexible Microelectronics on Their Way to Business,", SID Digest '07: SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1: Invited Paper: Optically Isotropic Nano-Structured Liquid Crystal Composites for Display Applications,", SID Digest '09: SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09: SID International Symposium Digest of Technical Papers, May 31, 2009, pp. 395-398.

Lee.H et al., "Current Status of, Challenges to, and Perspective View of AM-OLED ,", IDW '06: Proceedings of the 13th International Display Workshops, Dec. 7, 2006, pp. 663-666.

Kikuchi.H et al., "62.2: Invited Paper: Fast Electro-Optical Switching in Polymer-Stabilized Liquid Crystalline Blue Phases for Display Application,", SID Digest '07: SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel, YBFE2O4, and YB2FE3O7 Types of Structures for Compounds in the IN2O3 and SC2O3-A2O3-BO Systems [A: FE, GA, or AL; B: MG, MN, FE, NI, CU, or ZN] at Temperatures over 1000 °C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08: SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", JPN. J. Appl. Phys. (Japanese Journal No. 5B, pp. 4303-4308. of Applied Physics), 2006, vol. 45, No. 5B, pp. 4303-4308.

Janotti.A et al., "Native Point Defects in ZnO,", Phys. Rev. B (Physical Review. B), Oct. 4, 2007,vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29: Modeling of Amorphous Oxide Semiconductor Thin Film Transistors and Subgap Density of States,", SID Digest '08: SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4): a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08: Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of Zno Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

\* cited by examiner

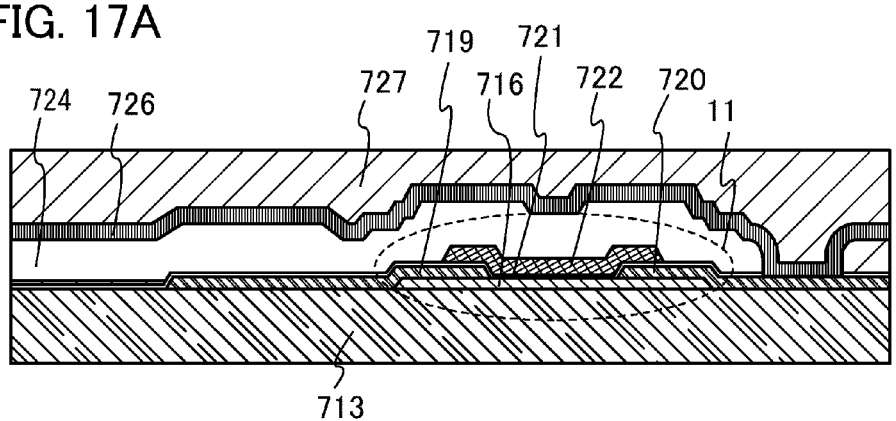
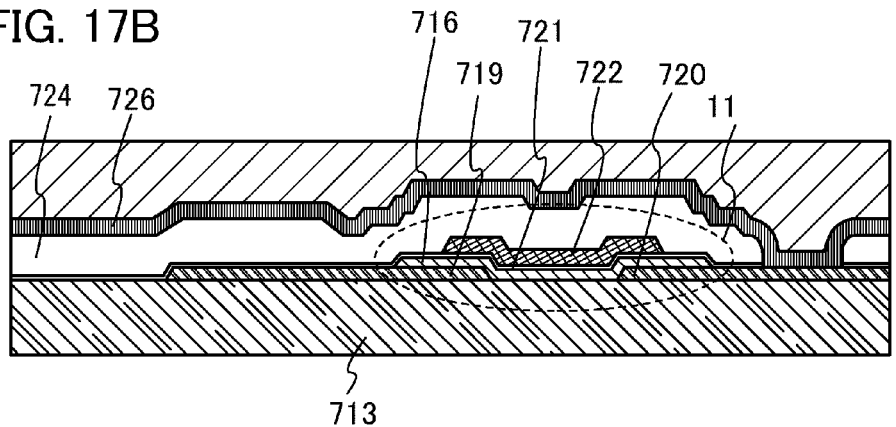

PROGRAMMABLE LSI

BACKGROUND OF THE INVENTION

1. Field of the Invention

The present invention relates to semiconductor devices. In particular, the present invention relates to programmable LSIs and semiconductor devices including the programmable LSIs. Further, the present invention relates to electronic devices including the semiconductor devices.

2. Description of the Related Art

Programmable LSIs show flexibility in a reduction in development period and a change in design specification as compared to conventional application specific integrated circuits (ASIC) and gate arrays, which is advantageous. Programmable LSIs are widely used in semiconductor devices.

A programmable LSI includes, for example, a plurality of logic elements and wirings between the logic elements. When the functions of the logic elements are changed, the function of the programmable LSI can be changed. The logic element includes, for example, a look-up table and the like. The look-up table performs arithmetic processing based on setting data on an input signal so that the input signal is used as an output signal. Here, the setting data is stored in storage circuits that correspond to the logic elements. In other words, the look-up table can perform different arithmetic processing in accordance with the data stored in the storage circuits. Thus, the functions of the logic elements can be specified when specific setting data is stored in the storage circuits.

The setting data or the like of the look-up table is referred to as configuration data. In addition, the storage circuits that correspond to the logic elements and store the configuration data are referred to as configuration memories. Further, storage of the configuration data in the configuration memory is referred to as configuration. In particular, rewrite (refresh) of the configuration data stored in the configuration memory is referred to as re-configuration. The circuit structure of the programmable LSI can be changed into a circuit structure suitable for a user's request when desired configuration data is produced (programmed) and configuration is performed.

The programmable LSI generally performs configuration (static configuration) under the condition that the operation of a semiconductor device including the programmable LSI is stopped. In contrast, a technique for performing configuration (dynamic configuration) when the semiconductor device operates in order to further exploit the features of the programmable LSI has attracted attention.

As a method for performing dynamic configuration, Patent Document 1 discloses a method in which a dynamic random access memory (DRAM) is provided separately from a configuration memory and configuration data to be written to the configuration memory is stored in the DRAM. The configuration memory is formed using a static random access memory (SRAM). Patent Document 1 shows a programmable LSI for performing configuration in a short time by reading configuration data from the DRAM and writing the configuration data to the SRAM that is the configuration memory.

[Reference]

Patent Document 1: Japanese Published Patent Application No. 10-285014.

SUMMARY OF THE INVENTION

In order to reduce power consumption, a driving method has been proposed by which supply of power supply voltage to the entire semiconductor device or part of the semiconductor device is temporarily stopped and supply of power supply voltage is selected only when needed in a circuit block which needs the supply (such a method is hereinafter referred to as normally off driving). Here, if a programmable LSI disclosed in Patent Document 1 employs normally off driving, when supply of power supply voltage to the programmable LSI is stopped, configuration data stored in a configuration memory is lost because an SRAM, which is a volatile storage circuit, is used as the configuration memory. Thus, when power supply voltage is supplied again, writing of configuration data to the configuration memory is needed. Consequently, after the power supply voltage is supplied again, it takes a long time for the programmable LSI to fulfill its function (to start) (i.e., a starting time is long). Accordingly, since it takes a long time for the programmable LSI disclosed in Patent Document 1 to start, it is difficult to stop supply of power supply voltage frequently in order to reduce power consumption. Thus, it is difficult to say that the programmable LSI disclosed in Patent Document 1 is suitable for normally off driving.

Thus, it is an object to provide a low-power programmable LSI that employs normally off driving and quickly starts. It is an object to provide a programmable LSI that can perform dynamic configuration.

One aspect of a programmable LSI (referred to as programmable logic circuit) in the present invention includes a plurality of logic elements. The plurality of logic elements each include a configuration memory. Each of the plurality of logic elements further includes a device for performing different arithmetic processing and changing an electrical connection between the logic elements in accordance with configuration data stored in the configuration memory. A storage circuit capable of retaining stored data (configuration data) even after supply of power supply voltage is stopped is used as the configuration memory.

One aspect of a programmable LSI in the present invention includes a plurality of logic elements. The plurality of logic elements each include a configuration memory, a look-up table, and a selection circuit. In each of the plurality of logic elements, configuration data stored in the configuration memory is input to the look-up table, and the look-up table performs different arithmetic processing in accordance with the configuration data. Configuration data stored in the configuration memory is input to the selection circuit, and the selection circuit changes an electrical connection between the logic elements in accordance with the configuration data. A storage circuit capable of retaining stored data (configuration data) even after supply of power supply voltage is stopped is used as the configuration memory.

One aspect of a programmable LSI in the present invention includes a plurality of logic elements. The plurality of logic elements each include a configuration memory, a look-up table, a selection circuit, and a register. In each of the plurality of logic elements, configuration data stored in the configuration memory is input to the look-up table, and the look-up table performs different arithmetic processing in accordance with the configuration data. Configuration data stored in the configuration memory is input to the selection circuit, and the selection circuit changes an electrical connection between the logic elements in accordance with the configuration data. An output signal from the look-up table and a clock signal are input to the register, and the register outputs a signal corresponding to the output signal in synchronization with the clock signal. A storage circuit capable of retaining stored data (configuration data) even after supply of power supply voltage is stopped is used as the configuration memory.

Note that one aspect of a programmable LSI in the present invention may further include a memory element. The memory element stores configuration data to be input to the plurality of logic elements. At least part of configuration data stored in the memory element is input to and stored in the configuration memory. The memory element may include a storage circuit capable of retaining stored data (configuration data) even after supply of power supply voltage is stopped.

One aspect of a programmable LSI in the present invention can further include a power supply circuit for controlling supply of power supply voltage to the plurality of logic elements. The power supply circuit can, for example, selectively supply power supply voltage to some of the plurality of logic elements and stop supply of power supply voltage to the remaining logic elements.

(Specific Example of Configuration Memory)

A storage circuit used as a configuration memory can include a set of volatile and nonvolatile storage circuits. The configuration memory with the structure can store data (configuration data) retained in the volatile storage circuit before supply of power supply voltage is stopped in the nonvolatile storage circuit (hereinafter this operation is also called data storage) in the case where normally off driving is performed. While the supply of power supply voltage is stopped, the data (configuration data) can be retained in the nonvolatile storage circuit (hereinafter this operation is also called data waiting). Then, after supply of power supply voltage is selected, the data (configuration data) retained in the nonvolatile storage circuit is input to the volatile storage circuit (hereinafter this operation is also called data provision), so that the data (configuration data) retained before the supply of power supply voltage is stopped can be retained in the volatile storage circuit again.

Here, the volatile storage circuit includes at least two arithmetic circuits. A feedback loop can be formed in which an output from one arithmetic circuit is input to the other arithmetic circuit and an output from the other arithmetic circuit is input to the one arithmetic circuit. Examples of a volatile storage circuit with such a structure include a flip-flop circuit and a latch circuit.

Note that in the configuration memory, the plurality of nonvolatile storage circuits for storing 1-bit data may be provided for one volatile storage circuit for storing 1-bit data. The configuration memory with the structure can store different pieces of data (configuration data) in the plurality of nonvolatile storage circuits before supply of power supply voltage is stopped, in the case where normally off driving is performed. While the supply of power supply voltage is stopped, waiting of these pieces of data can be performed. Then, when supply of power supply voltage is selected, one nonvolatile storage circuit is selected from the plurality of nonvolatile storage circuits, and 1-bit data retained in the selected nonvolatile storage circuit can be provided for the volatile storage circuit. In this manner, the state of the configuration memory after supplying power supply voltage can be selected from a plurality of states.

As the nonvolatile storage circuit used in the configuration memory, it is possible to use a storage circuit that includes a transistor whose off-state current is extremely low and a capacitor whose one of a pair of electrodes is electrically connected to a node that is set in a floating state when the transistor is turned off. Note that gate capacitance of the transistor can be used as the capacitor. The storage circuit stores data by control of the potential of the one electrode of the capacitor (or the amount of electric charge corresponding to the potential) depending on the data. For example, the storage circuit can store 1-bit data when a state in which predetermined electric charge is held in the capacitor corresponds to "1" and a state in which electric charge is not held in the capacitor corresponds to "0". Here, as the transistor whose off-state current is extremely low, it is possible to use a transistor which has a channel in a layer or substrate including a semiconductor whose band gap is wider than that of silicon. A compound semiconductor is an example of the semiconductor whose band gap is wider than that of silicon. Examples of the compound semiconductor include an oxide semiconductor and a nitride semiconductor. A transistor which has a channel in an oxide semiconductor layer can be used as the transistor whose off-state current is extremely low, for example.

In the nonvolatile storage circuit, when the transistor whose off-state current is extremely low is turned off, the potential of the one electrode of the capacitor can be held for a long time even after supply of power supply voltage is stopped. Thus, stored data (configuration data) can be retained in the configuration memory including the nonvolatile storage circuit even after supply of power supply voltage is stopped.

Data is stored in the nonvolatile storage circuit after a signal potential corresponding to the data is input to a predetermined node (the one electrode of the capacitor), the transistor whose off-state current is extremely low is turned off, and the node is set in a floating state. Thus, the nonvolatile storage circuit does not easily cause degradation due to repetitive data rewriting, and rewritability can be improved.

Note that the nonvolatile storage circuit can have a known structure. For example, it is possible to use a nonvolatile storage circuit that includes a tunnel magnetoresistance (TMR) element having a magnetic tunnel junction (MTJ). Further, for example, it is possible to use a nonvolatile storage circuit including a ferroelectric element.

(Specific Example of Memory Element)

A memory element can include a plurality of storage circuits. Note that the plurality of storage circuits may be arranged in matrix. As a storage circuit used in the memory element, it is possible to use a storage circuit that includes a transistor whose off-state current is extremely low and a capacitor whose one of a pair of electrodes is electrically connected to a node that is set in a floating state when the transistor is turned off. The structure of the storage circuit can be similar to the structure of the nonvolatile storage circuit used in the configuration memory, for example.

With the use of the nonvolatile storage circuit, even after supply of power supply voltage is stopped, a configuration memory can continue to retain configuration data for a long time. Thus, after supply of power supply voltage is stopped, writing of configuration data to the configuration memory is not needed when power supply voltage is supplied again, so that the starting time of a programmable LSI can be shortened. Consequently, in the programmable LSI, supply of power supply voltage can be frequently stopped, and power consumption can be markedly reduced by normally off driving.

In the case where the configuration memory includes a set of volatile and nonvolatile storage circuits, configuration data can be stored in and output from the volatile storage circuit while power supply voltage is supplied. Here, the operation speed of a volatile storage circuit (e.g., a flip-flop circuit or a latch circuit) is high. Thus, the access speed of the configuration memory can be increased. In this manner, a programmable LSI that can perform dynamic configuration can be provided. Further, when a highly reliable circuit whose rewritability is high is used as the nonvolatile storage circuit used in the configuration memory, the durability and reliability of the programmable LSI can be improved.

BRIEF DESCRIPTION OF THE DRAWINGS

In the accompanying drawings:

FIGS. 17A and 17B are cross-sectional views each illustrating the structure of a transistor whose channel is formed in an oxide semiconductor layer;

DETAILED DESCRIPTION OF THE INVENTION

Figure 1A:
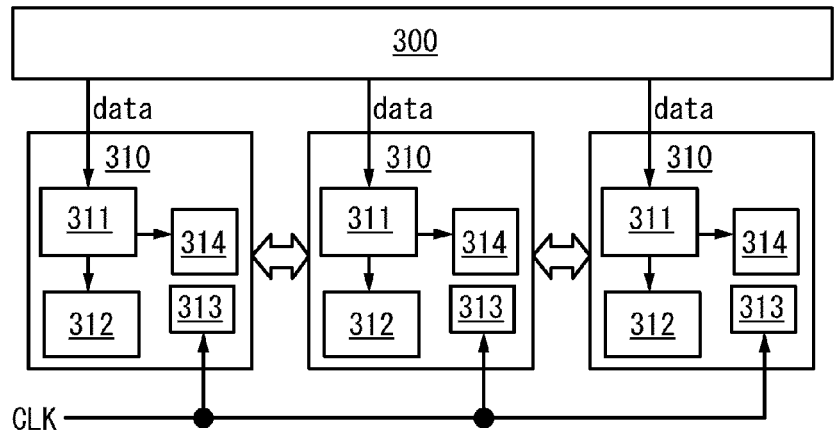
FIG. 1A is a block diagram of a programmable LSI.

Embodiments and an example will be described in detail below with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments and the example.

Note that the functions of a "source" and a "drain" might interchange when a transistor of opposite polarity is used or the direction of current flow is changed in circuit operation, for example. Thus, in this specification, the terms "source" and "drain" can interchange.

An expression "electrically connected" means that components are connected to each other through an object having any electric action. Here, there is no particular limitation on an object having any electric action as long as electric signals can be transmitted and received between components that are connected to each other. Examples of an object having any electric action include an electrode, a wiring, a switching element such as a transistor, a resistor, an inductor, a capacitor, and an element with a variety of functions.

Even when independent components are electrically connected to each other in a circuit diagram, one conductive film might have functions of a plurality of components, for example, part of a wiring functions as an electrode. The expression "electrically connected" in this specification also means that one conductive film has functions of a plurality of components.

The term "over" or "below" does not necessarily mean that a component is placed "directly on" or "directly under" another component. For example, an expression "a gate electrode over a gate insulating layer" does not exclude the case where another component is placed between the gate insulating layer and the gate electrode.

The position, size, range, or the like of each component illustrated in drawings and the like is not accurately represented for easy understanding in some cases. Thus, the disclosed invention is not necessarily limited to the position, size, range, or the like disclosed in the drawings and the like.

Ordinal numbers such as "first", "second", and "third" are used in order to avoid confusion among components.

(Embodiment 1)

One aspect of a programmable LSI is described.

FIG. 1A schematically illustrates the structure of a programmable LSI. The programmable LSI includes a plurality of logic elements 310 and a memory element 300. FIG. 1A typically illustrates the three logic elements 310. The number of logic elements can be a given number. The programmable LSI may further include plural sets of the plurality of logic elements 310 and the memory element 300. Alternatively, the programmable LSI may further include a multiplier, a RAM block, a PLL block, or an I/O element. The multiplier has a function of multiplying plural pieces of data at high speed. The RAM block functions as a memory for storing given data. The PLL block has a function of supplying a clock signal to a circuit in the programmable LSI. The I/O element has a function of controlling signal passing between the programmable LSI and an external circuit.

The logic element 310 includes a configuration memory 311, a look-up table 312, a selection circuit 314, and a register 313. Note that the logic element 310 may further include a different register, a multiplexer, or a switch.

In the logic element 310, the look-up table 312 performs different arithmetic processing in accordance with configuration data stored in the configuration memory 311.

In the logic element 310, the selection circuit 314 changes an electrical connection with the different logic element 310 in accordance with the configuration data stored in the configuration memory 311. For example, the selection circuit 314 changes an electrical connection in a wiring resource provided in the programmable LSI. In this manner, an electrical connection between the logic elements 310 or an electrical connection between the logic element 310 and a different circuit (e.g., a multiplier, a RAM block, a PLL block, or an I/O element) is changed.

In the logic element 310, an output signal from the look-up table 312 and a clock signal (CLK) are input to the register 313, and a signal corresponding to the output signal is output in synchronization with the clock signal (CLK). The output signal from the register 313 or the output signal from the look-up table 312 is used as an output signal from the logic element 310 and is output to the different logic element 310 (e.g., the adjacent logic element 310) or the like in accordance with an electrical connection selected by the selection circuit 314. Here, in the logic element 310, a multiplexer or the like for selecting the output signal from the register 313 or the output signal from the look-up table 312 may be provided.

Note that although FIG. 1A schematically illustrates the structure where the configuration memories 311 are positioned in one place in one logic element 310, this embodiment is not limited to this structure. The configuration memories 311 may be positioned in plural places so that they are provided in the look-up table 312, the selection circuit 314, and the like.

Note that in the structure of the logic element 310 in FIG. 1A, it is possible not to provide the register 313. Alternatively, the programmable LSI may include the logic element 310 that includes the register 313 and the logic element 310 that does not include the register 313. In the logic element 310 that does not include the register 313, an output of the look-up table 312 can be used as an output of the logic element 310.

(Structure of Configuration Memory 311)

Figure 1B:
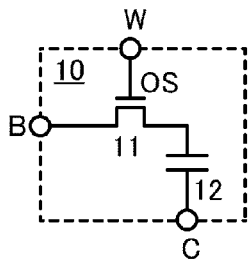
FIGS. 1B to 1D are circuit diagrams of a configuration memory.
Figure 1C:
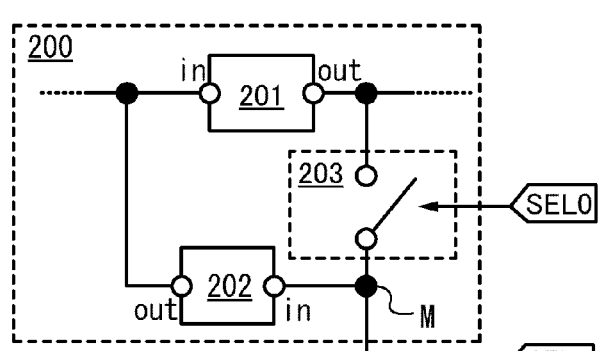

FIG. 1C illustrates one aspect of a storage circuit used in the configuration memory 311. In FIG. 1C, the storage circuit used in the configuration memory 311 includes a set of a volatile storage circuit 200 and a nonvolatile storage circuit 10. The configuration memory 311 can include the storage circuits.

FIG. 1B illustrates the structure of the nonvolatile storage circuit 10 in FIG. 1C. In FIG. 1B, the nonvolatile storage circuit 10 includes a transistor 11 and a capacitor 12. Note that in FIG. 1B, "OS" is written beside the transistor 11 in order to indicate that a channel of the transistor 11 is formed in an oxide semiconductor layer. A gate of the transistor 11 is electrically connected to a terminal W. One of a source and a drain of the transistor 11 is electrically connected to a terminal B. The other of the source and the drain of the transistor 11 is electrically connected to one of a pair of electrodes of the capacitor 12. The other of the pair of electrodes of the capacitor 12 is electrically connected to a terminal C.

The nonvolatile storage circuit 10 stores data by control of the potential of the one electrode of the capacitor 12 (or the amount of electric charge corresponding to the potential) depending on the data. For example, the storage circuit can store 1-bit data when a state in which predetermined electric charge is held in the capacitor 12 corresponds to "1" and a state in which electric charge is not held in the capacitor 12 corresponds to "0". In the nonvolatile storage circuit 10, since the off-state current of the transistor 11 is extremely low, when the transistor 11 is turned off, the potential of the one electrode of the capacitor 12 (i.e., data) can be held for a long time even after supply of power supply voltage is stopped. Data is stored in the nonvolatile storage circuit 10 after a signal potential corresponding to the data is input to a predetermined node (the one electrode of the capacitor 12), the transistor 11 is turned off, and the node is set in a floating state. Thus, the nonvolatile storage circuit 10 does not easily cause degradation due to repetitive data rewriting, and rewritability can be improved.

The volatile storage circuit 200 in FIG. 1C includes an arithmetic circuit 201, an arithmetic circuit 202, and a feedback loop in which an output from the arithmetic circuit 201 is input to the arithmetic circuit 202 and an output from the arithmetic circuit 202 is input to the arithmetic circuit 201. Examples of the volatile storage circuit 200 include a flip-flop circuit and a latch circuit. Note that a clock signal may be input to either one or both the arithmetic circuit 201 and the arithmetic circuit 202.

In FIG. 1C, the terminal B of the nonvolatile storage circuit 10 is electrically connected to a node M that exists between an input terminal of the arithmetic circuit 202 and an output terminal of the arithmetic circuit 201. The volatile storage circuit 200 further includes a switch 203 for selecting an electrical connection between the node M and the output terminal of the arithmetic circuit 201. On or off of the switch 203 is selected by a control signal SEL0. Note that in the case where the arithmetic circuit 201 selectively outputs a signal in response to a control signal (e.g., a clock signal), the switch 203 is not necessarily provided, and it is possible not to provide the switch 203. A control signal SEL is input to the terminal W of the nonvolatile storage circuit 10. Note that a fixed potential (e.g., a low power supply potential) can be input to the terminal C of the nonvolatile storage circuit 10.

The case is described in which normally off driving is employed in a programmable LSI that includes the configuration memory 311 including the storage circuit having the set of the volatile storage circuit 200 and the nonvolatile storage circuit 10 in FIG. 1C.

(Operation during Supply of Power Supply Voltage)

While power supply voltage is supplied to the set, that is, while power supply voltage is supplied to the configuration memory 311 having the set, the switch 203 is on by the control signal SEL0. In this manner, the volatile storage circuit 200 retains data with the feedback loop constituted of the arithmetic circuit 201 and the arithmetic circuit 202. In other words, in the set in FIG. 1C, data (configuration data) input is retained with the feedback loop of the volatile storage circuit 200, and the data (configuration data) is output from the feedback loop of the volatile storage circuit 200. The feedback loop of the volatile storage circuit 200 can retain and output the data (configuration data) at high speed. Thus, dynamic configuration can be easily performed.

(Operation of Data Storage)

As described above, while or after data (configuration data) is retained with the feedback loop of the volatile storage circuit 200, the transistor 11 in the nonvolatile storage circuit 10 is turned on by the control signal SEL while the switch 203 is kept on by the control signal SEL0. Thus, the potential of the node M in the volatile storage circuit 200 is input to the one electrode of the capacitor 12 in the nonvolatile storage circuit 10, so that the data retained in the volatile storage circuit 200 can be stored in the nonvolatile storage circuit 10. In this manner, data can be stored.

(Operation of Data Waiting)

When the transistor 11 in the nonvolatile storage circuit 10 is turned off after the data is stored, the data stored in the nonvolatile storage circuit 10 is made not to vary depending on a signal from the volatile storage circuit 200. In this manner, data waiting can be performed. In the nonvolatile storage circuit 10, since the off-state current of the transistor 11 is extremely low, when the transistor 11 is turned off, the potential of the one electrode of the capacitor 12 (i.e., data) can be held for a long time even after supply of power supply voltage is stopped.

After the data waiting is performed as described above, supply of power supply voltage to the configuration memory 311 is stopped.

(Operation of Data Supply)

After supply of power supply voltage to the set is selected, that is, after supply of power supply voltage to the configuration memory 311 having the set is started, the switch 203 is turned off by the control signal SEL0 and the transistor 11 in the nonvolatile storage circuit 10 is turned on by the control signal SEL. In this manner, the potential of the one electrode of the capacitor 12 in the nonvolatile storage circuit 10 (or the amount of electric charge corresponding to the potential) is input to the node M in the volatile storage circuit 200. Then, the switch 203 is turned on by the control signal SEL0. Accordingly, data (configuration data) retained in the nonvolatile storage circuit 10 is input to the volatile storage circuit 200 so that the feedback loop can retain the data. In this manner, data can be supplied to the volatile storage circuit 200. Here, the volatile storage circuit 200 has higher data writing speed and data reading speed than the nonvolatile storage circuit 10; thus, the operation speed of the set in which supply of power supply voltage is selected can be increased. Thus, dynamic configuration can be easily performed.

Note that in the case where the arithmetic circuit 201 is a circuit for selectively outputting a signal in response to a control signal (e.g., a clock signal) and the switch 203 is not provided, when the switch 203 is turned off in the above description, the arithmetic circuit 201 is controlled so that the arithmetic circuit 201 does not output a signal (i.e., an output of the arithmetic circuit 201 is a restricted combination). A method for driving circuits except the arithmetic circuit 201 can be similar to the above method.

The above is the description of normally off driving in the programmable LSI that includes the configuration memory 311 including the storage circuit having the set of the volatile storage circuit 200 and the nonvolatile storage circuit 10 in FIG. 1C.

(Variation 1 of Configuration Memory 311)

The structure of the storage circuit used in the configuration memory 311 is not limited to the structure in FIG. 1C. For example, a structure in FIG. 1D can be used.

For example, a plurality of nonvolatile storage circuits for storing 1-bit data may be provided for one volatile storage circuit for storing 1-bit data. In the structure in FIG. 1D, a nonvolatile storage circuit 10-1 and a nonvolatile storage circuit 10-2 are provided for the volatile storage circuit 200. In the structure in FIG. 1D, the structures of the nonvolatile storage circuit 10-1 and the nonvolatile storage circuit 10-2 can be similar to the structure of the nonvolatile storage circuit 10 in FIG. 1B; thus, detailed description thereof is omitted. Note that a control signal SEL1 is input to a terminal W of the nonvolatile storage circuit 10-1, a control signal SEL2 is input to a terminal W of the nonvolatile storage circuit 10-2, and terminals B of the nonvolatile storage circuit 10-1 and the nonvolatile storage circuit 10-2 are electrically connected to the node M. Further, the structure of the volatile storage circuit 200 can be similar to the structure of the volatile storage circuit 200 in FIG. 1B; thus, detailed description thereof is omitted.

Figure 1D:
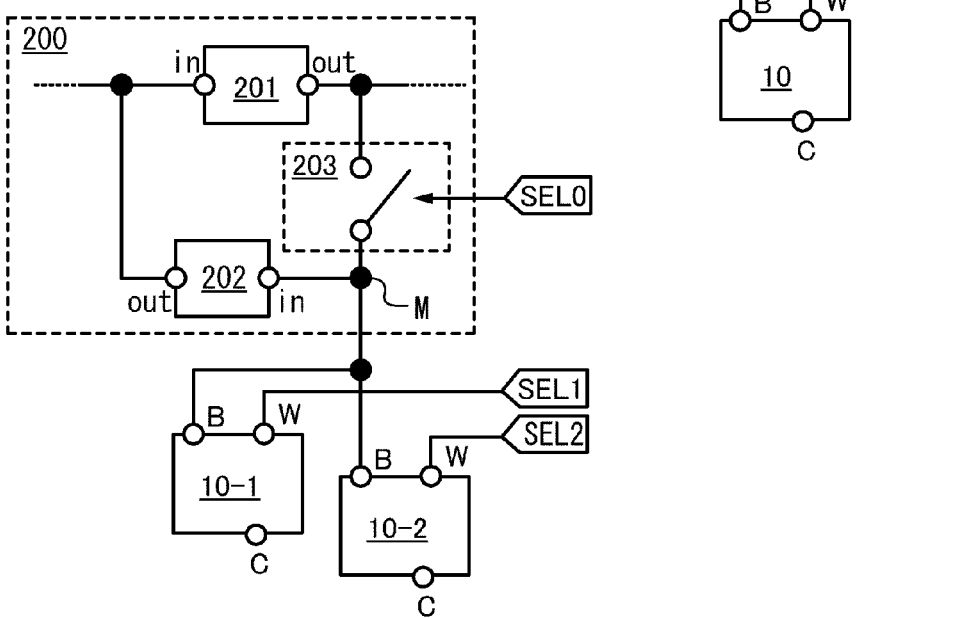

The configuration memory 311 having a storage circuit with the structure in FIG. 1D can store different pieces of data (configuration data) in the plurality of nonvolatile storage circuits (the nonvolatile storage circuit 10-1 and the nonvolatile storage circuit 10-2) by the control signal SEL1 and the control signal SEL2 before supply of power supply voltage is stopped, in the case where normally off driving is performed. While the supply of power supply voltage is stopped, waiting of these pieces of data can be performed. Then, when supply of power supply voltage is selected, one nonvolatile storage circuit is selected from the plurality of nonvolatile storage circuits (the nonvolatile storage circuit 10-1 and the nonvolatile storage circuit 10-2) by the control signal SEL1 and the control signal SEL2, and 1-bit data retained in the selected nonvolatile storage circuit can be provided for the volatile storage circuit 200. In this manner, the state of the configuration memory 311 after supplying power supply voltage can be selected from a plurality of states. When one nonvolatile storage circuit is selected from the plurality of nonvolatile storage circuits (the nonvolatile storage circuit 10-1 and the nonvolatile storage circuit 10-2) and data retained in the selected nonvolatile storage circuit is provided for the volatile storage circuit 200, dynamic configuration can be easily performed.

(Variation 2 of Configuration Memory 311)

Figure 2A:
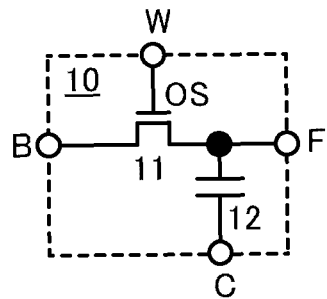
FIGS. 2A to 2C are circuit diagrams of a configuration memory.
Figure 2B:
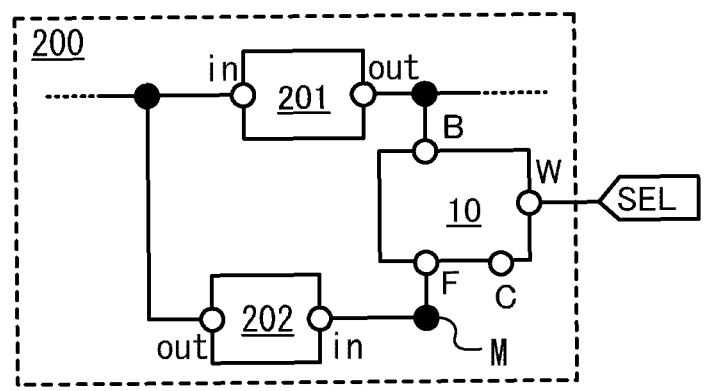
Figure 2C:
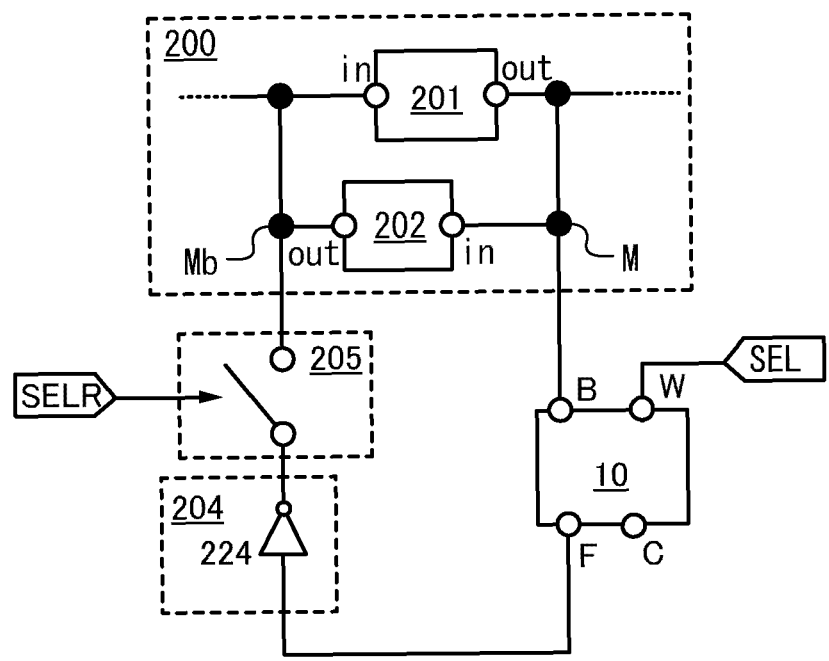

For example, the storage circuit used in the configuration memory 311 can have a structure in FIG. 2C. In the volatile storage circuit 200 in FIG. 2C, the switch 203 in FIG. 1C is not provided because the switch 203 is not necessarily needed. A terminal F of the nonvolatile storage circuit 10 in FIG. 2C is electrically connected to the one electrode of the capacitor 12, as illustrated in FIG. 2A. In FIG. 2C, the terminal F of the nonvolatile storage circuit 10 is electrically connected to an output terminal of the arithmetic circuit 202 and an input terminal of the arithmetic circuit 201 in the volatile storage circuit through an arithmetic circuit 204 and a switch 205. An inverter 224 can be used as the arithmetic circuit 204, for example. On or off of the switch 205 is selected by a control signal SELR.

The case is described in which normally off driving is employed in a programmable LSI that includes the configuration memory 311 including the storage circuit having the set of the volatile storage circuit 200 and the nonvolatile storage circuit 10 in FIG. 2C.

(Operation during Supply of Power Supply Voltage)

While power supply voltage is supplied to the set, that is, while power supply voltage is supplied to the configuration memory 311 having the set, the switch 205 is off by the control signal SELR. In this manner, the volatile storage circuit 200 retains data with the feedback loop constituted of the arithmetic circuit 201 and the arithmetic circuit 202. In other words, in the set in FIG. 2C, data (configuration data) input is retained with the feedback loop of the volatile storage circuit 200, and the data (configuration data) is output from the feedback loop of the volatile storage circuit 200. The feedback loop of the volatile storage circuit 200 can retain and output the data (configuration data) at high speed. Thus, dynamic configuration can be easily performed.

(Operation of Data Storage)

As described above, while or after data (configuration data) is retained with the feedback loop of the volatile storage circuit 200, the transistor 11 in the nonvolatile storage circuit 10 is turned on by the control signal SEL while the switch 205 is kept off by the control signal SELR. Thus, the potential of the node M in the volatile storage circuit 200 is input to the one electrode of the capacitor 12 in the nonvolatile storage circuit 10, so that the data retained in the volatile storage circuit 200 can be stored in the nonvolatile storage circuit 10. In this manner, data can be stored.

(Operation of Data Waiting)

When the transistor 11 in the nonvolatile storage circuit 10 is turned off after the data is stored, the data stored in the nonvolatile storage circuit 10 is made not to vary depending on a signal from the volatile storage circuit 200. In this manner, data waiting can be performed. In the nonvolatile storage circuit 10, since the off-state current of the transistor 11 is extremely low, when the transistor 11 is turned off, the potential of the one electrode of the capacitor 12 (i.e., data) can be held for a long time even after supply of power supply voltage is stopped.

After the data waiting is performed as described above, supply of power supply voltage to the configuration memory 311 is stopped.

(Operation of Data Supply)

After supply of power supply voltage to the set is selected, that is, after supply of power supply voltage to the configuration memory 311 having the set is started, the switch 205 is turned on by the control signal SELR. In this manner, a signal corresponding to the potential of the one electrode of the capacitor 12 in the nonvolatile storage circuit 10 (or the amount of electric charge corresponding to the potential) is inverted by the inverter 224 so that the signal can be input to a node Mb in the volatile storage circuit 200. Accordingly, data (configuration data) retained in the nonvolatile storage circuit 10 is input to the volatile storage circuit 200 so that the feedback loop can retain the data. In this manner, data can be supplied to the volatile storage circuit 200. Here, the volatile storage circuit 200 has higher data writing speed and data reading speed than the nonvolatile storage circuit 10; thus, the operation speed of the set in which supply of power supply voltage is selected can be increased. Thus, dynamic configuration can be easily performed.

Note that a structure can be used in which the arithmetic circuit 204 is a circuit for selectively outputting a signal in response to a control signal (e.g., a clock signal) and the switch 205 is not provided. In that case, when the switch 205 is turned off in the above description, the arithmetic circuit 204 is controlled so that the arithmetic circuit 204 does not output a signal (i.e., an output of the arithmetic circuit 204 is a restricted combination). A method for driving circuits except the arithmetic circuit 204 can be similar to the above method.

The above is the description of normally off driving in the programmable LSI that includes the configuration memory 311 including the storage circuit having the set of the volatile storage circuit 200 and the nonvolatile storage circuit 10 in FIG. 2C.

(Variation 3 of Configuration Memory 311)

For example, the storage circuit used in the configuration memory 311 can have a structure in FIG. 2B. In the storage circuit in FIG. 2B, the nonvolatile storage circuit 10 is included in the volatile storage circuit 200. The terminal F of the nonvolatile storage circuit 10 in FIG. 2B is electrically connected to the one electrode of the capacitor 12, as illustrated in FIG. 2A.

The case is described in which normally off driving is employed in a programmable LSI that includes the configuration memory 311 including the storage circuit having the set of the volatile storage circuit 200 and the nonvolatile storage circuit 10 in FIG. 2B.

(Operation during Supply of Power Supply Voltage)

While power supply voltage is supplied to the set, that is, while power supply voltage is supplied to the configuration memory 311 having the set, the transistor 11 in the nonvolatile storage circuit 10 is on by the control signal SEL. In this manner, the volatile storage circuit 200 retains data with the feedback loop constituted of the arithmetic circuit 201 and the arithmetic circuit 202. In other words, in the set in FIG. 2B, data input is retained with the feedback loop of the volatile storage circuit 200, and the data is output from the feedback loop of the volatile storage circuit 200. The feedback loop of the volatile storage circuit 200 can retain and output the data at high speed. Thus, dynamic configuration can be easily performed.

(Operation of Data Storage)

As described above, while data is retained with the feedback loop of the volatile storage circuit 200, the potential of the node M in the volatile storage circuit 200 is input to the one electrode of the capacitor 12 in the nonvolatile storage circuit 10, so that the data retained in the volatile storage circuit 200 can be stored in the nonvolatile storage circuit 10. In this manner, data can be stored.

(Operation of Data Waiting)

When the transistor 11 in the nonvolatile storage circuit 10 is turned off by the control signal SEL after the data is stored, the data stored in the nonvolatile storage circuit 10 is made not to vary depending on a signal from the arithmetic circuit 201 in the volatile storage circuit 200. In this manner, data waiting can be performed.

After the data waiting is performed as described above, supply of power supply voltage is stopped.

(Operation of Data Supply)

After supply of power supply voltage to the set is selected, that is, after supply of power supply voltage to the configuration memory 311 having the set is started again, the transistor 11 in the nonvolatile storage circuit 10 is turned on by the control signal SEL. In this manner, the potential of the one electrode of the capacitor 12 in the nonvolatile storage circuit 10 (or electric charge corresponding to the potential) is input to the node M in the volatile storage circuit 200. Accordingly, data retained in the nonvolatile storage circuit 10 can be retained with the feedback loop of the volatile storage circuit 200. In this manner, data can be supplied to the volatile storage circuit 200. Here, the volatile storage circuit 200 has higher data writing speed and data reading speed than the nonvolatile storage circuit 10; thus, the operation speed of the set in which supply of power supply voltage is selected can be increased. Thus, dynamic configuration can be easily performed.

Note that in the case where the data supply is performed, it is preferable that no signal be output from the arithmetic circuit 201 (i.e., an output of the arithmetic circuit 201 is a restricted combination) when the transistor 11 in the nonvolatile storage circuit 10 is turned on by the control signal SEL after supply of power supply voltage is selected. For example, it is preferable to use a circuit for selectively outputting a signal in response to a control signal (e.g., a clock signal) as the arithmetic circuit 201. Further, for example, it is preferable that a switch or the like be provided between the output terminal of the arithmetic circuit 201 and the terminal B of the nonvolatile storage circuit 100 and that the switch be turned off when the transistor 11 in the nonvolatile storage circuit 10 is turned on by the control signal SEL after supply of power supply voltage is selected.

The above is the description of normally off driving in the programmable LSI that includes the configuration memory 311 including the storage circuit having the set of the volatile storage circuit 200 and the nonvolatile storage circuit 10 in FIG. 2B.

In the programmable LSI in this embodiment, after supply of power supply voltage is stopped, writing of configuration data to the configuration memory is not needed when power supply voltage is supplied again, so that the starting time of the programmable LSI can be shortened. Consequently, in the programmable LSI, supply of power supply voltage can be frequently stopped, and power consumption can be markedly reduced by normally off driving.

Further, configuration data can be stored in and output from the volatile storage circuit 200 while power supply voltage is supplied. Here, the operation speed of a volatile storage circuit (e.g., a flip-flop circuit or a latch circuit) is high. Thus, the access speed of the configuration memory 311 can be increased. In this manner, a programmable LSI that can perform dynamic configuration can be provided. Furthermore, since a highly reliable circuit whose rewritability is high is used as the nonvolatile storage circuit used in the configuration memory 311, the durability and reliability of the programmable LSI can be improved.

This embodiment can be combined with any of the other embodiments as appropriate.

(Embodiment 2)

In this embodiment, a more specific aspect of the memory element 300 is described. The memory element 300 can include a plurality of storage circuits. As a storage circuit used in the memory element 300, it is possible to use a storage circuit (hereinafter referred to as a memory cell) that includes a transistor whose channel is formed in an oxide semiconductor layer and a node that is set in a floating state when the transistor is turned off. FIGS. 5B to 5D illustrate one aspect of the memory cell.

(Structure 1 of Memory Cell)

A memory cell 100a in FIG. 5B includes a transistor 101, a transistor 102, and a capacitor 103. A channel of the transistor 101 is formed in an oxide semiconductor layer. Note that in FIG. 5B, "OS" is written beside the transistor 101 in order to indicate that the channel of the transistor 101 is formed in the oxide semiconductor layer. A gate of the transistor 101 is electrically connected to a terminal W. One of a source and a drain of the transistor 101 is electrically connected to a terminal D. The other of the source and the drain of the transistor 101 is electrically connected to a gate of the transistor 102. One of a source and a drain of the transistor 102 is electrically connected to a terminal S. The other of the source and the drain of the transistor 102 is electrically connected to a terminal B. One of a pair of electrodes of the capacitor 103 is electrically connected to the gate of the transistor 102. The other of the pair of electrodes of the capacitor 103 is electrically connected to a terminal C. Here, each terminal can be electrically connected to a wiring or an electrode.

A wiring electrically connected to the terminal W, a wiring electrically connected to the terminal C, a wiring electrically connected to the terminal D, and a wiring electrically connected to the terminal B are also referred to as a write word line, a read word line, a data line, and a bit line, respectively. Note that the data line and the bit line can be merged into a single wiring. Here, in the case where the data line and the bit line are merged into a single wiring, the wiring is referred to as a bit line.

Here, a node which is set in a floating state when the transistor 101 whose channel is formed in the oxide semiconductor layer is turned off can be the gate of the transistor 102 or the one electrode of the capacitor 103.

(Method for Driving Memory Cell 100a)

A method for driving the memory cell 100a in FIG. 5B is described.

First, writing of data to the memory cell 100a is described. A signal potential (a signal potential input to the terminal D) corresponding to data (configuration data) is input to the gate of the transistor 102 and the one electrode of the capacitor 103 through the transistor 101 which is turned on by a control signal input to the gate of the transistor 101 (a control signal input to the terminal W). Then, when the transistor 101 is turned off by the control signal input to the gate of the transistor 101 (the control signal input to the terminal W), the signal potential is held in the gate of the transistor 102 and the one electrode of the capacitor 103. In this manner, data can be written to the memory cell 100a.

Here, the off-state current of the transistor 101 whose channel is formed in the oxide semiconductor layer is extremely low. Thus, the potentials (the signal potentials) of the gate of the transistor 102 and the one electrode of the capacitor 103 can be held for a long time even while power supply voltage is not supplied to the memory cell 100a. Consequently, the memory cell 100a can retain data even after supply of power supply voltage is stopped.

Then, reading of data from the memory cell 100a is described. The potential of the source (the terminal S) of the transistor 102 and the potential of the other electrode (the terminal C) of the capacitor 103 are potentials at which the state between the source and the drain of the transistor 102 is changed in accordance with the signal potentials. Here, the state between the source and the drain of the transistor 102 is a non-conduction state or a conduction state. By detection of the state between the source and the drain of the transistor 102, data retained in the memory cell 100a is read.

Note that by control of the potential of the terminal C, the transistor 102 can be turned on, that is, the state between the source and the drain of the transistor 102 can be a conduction state regardless of data retained in the memory cell 100a. Further, by control of the potential of the terminal C, the transistor 102 can be turned off, that is, the state between the source and the drain of the transistor 102 can be a non-conduction state regardless of data retained in the memory cell 100a.

The above is the description of the method for driving the memory cell 100a.

When data is written to and read from each of the plurality of memory cells 100a included in the memory element 300 as described above, the memory element 300 can write and read plural pieces of data (configuration data).

(Structure 2 of Memory Cell)

A memory cell whose structure is different from Structure 1 of the memory cell is described.

A memory cell 100b in FIG. 5C includes the transistor 101, the transistor 102, and a transistor 141. The channel of the transistor 101 is formed in the oxide semiconductor layer. Note that in FIG. 5C, "OS" is written beside the transistor 101 in order to indicate that the channel of the transistor 101 is formed in the oxide semiconductor layer. The gate of the transistor 101 is electrically connected to the terminal W. The one of the source and the drain of the transistor 101 is electrically connected to the terminal D. The other of the source and the drain of the transistor 101 is electrically connected to the gate of the transistor 102. The one of the source and the drain of the transistor 102 is electrically connected to the terminal S. The other of the source and the drain of the transistor 102 is electrically connected to the terminal B through a source and a drain of the transistor 141. A gate of the transistor 141 is electrically connected to a terminal X. Here, each terminal can be electrically connected to a wiring or an electrode.

The wiring electrically connected to the terminal W, a wiring electrically connected to the terminal X, the wiring electrically connected to the terminal D, and the wiring electrically connected to the terminal B are also referred to as a write word line, a read word line, a data line, and a bit line, respectively. Note that the data line and the bit line can be merged into a single wiring. Here, in the case where the data line and the bit line are merged into a single wiring, the wiring is referred to as a bit line.

Here, a node which is set in a floating state when the transistor 101 whose channel is formed in the oxide semiconductor layer is turned off can be the gate of the transistor 102.

(Method for Driving Memory Cell 100b)

A method for driving the memory cell 100b in FIG. 5C is described.

First, writing of data to the memory cell 100b is described. A signal potential (a signal potential input to the terminal D) corresponding to data (configuration data) is input to the gate of the transistor 102 through the transistor 101 which is turned on by a control signal input to the gate of the transistor 101 (a control signal input to the terminal W). Then, when the transistor 101 is turned off by the control signal input to the gate of the transistor 101 (the control signal input to the terminal W), the signal potential is held in the gate of the transistor 102. In this manner, data can be written to the memory cell 100b.

Here, the off-state current of the transistor 101 whose channel is formed in the oxide semiconductor layer is extremely low. Thus, the potential (the signal potential) of the gate of the transistor 102 can be held for a long time even while power supply voltage is not supplied to the memory cell 100b. Consequently, the memory cell 100b can retain data even after supply of power supply voltage is stopped.

Then, reading of data from the memory cell 100b is described. The potential of the source (the terminal S) of the transistor 102 is a potential at which the state between the source and the drain of the transistor 102 is changed in accordance with the signal potential. Here, the state between the source and the drain of the transistor 102 is a non-conduction state or a conduction state. Data retained in the memory cell 100b is read by detection of the state between the source and the drain of the transistor 102 while the transistor 141 is turned on by a control signal input to the gate of the transistor 141 (a control signal input to the terminal X).

Note that a fixed potential (e.g., a low power supply potential such as a ground potential) can be input to the terminal S (a wiring electrically connected to the terminal S).

The above is the description of the method for driving the memory cell 100b.

When data is written to and read from each of the plurality of memory cells 100b included in the memory element 300 as described above, the memory element 300 can write and read plural pieces of data (configuration data).

(Structure 3 of Memory Cell)

A memory cell whose structure is different from Structure 1 of the memory cell and Structure 2 of the memory cell is described.

A memory cell 100c in FIG. 5D includes a transistor 104 and a capacitor 105. A channel of the transistor 104 is formed in an oxide semiconductor layer. In FIG. 5D, "OS" is written beside the transistor 104 in order to indicate that the channel of the transistor 104 is formed in the oxide semiconductor layer. A gate of the transistor 104 is electrically connected to a terminal W. One of a source and a drain of the transistor 104 is electrically connected to a terminal B. The other of the source and the drain of the transistor 104 is electrically connected to one of a pair of electrodes of the capacitor 105. Here, each terminal can be electrically connected to a wiring or an electrode.

The wiring electrically connected to the terminal W and the wiring electrically connected to the terminal B are also referred to as a word line and a bit line, respectively.

Here, a node which is set in a floating state when the transistor 104 whose channel is formed in the oxide semiconductor layer is turned off can be the one electrode of the capacitor 105.

(Method for Driving Memory Cell 100c)

A method for driving the memory cell 100c in FIG. 5D is described.

First, writing of data to the memory cell 100c is described. A signal potential (a signal potential input to the terminal B) corresponding to data (configuration data) is input to the one electrode of the capacitor 105 through the transistor 104 which is turned on by a control signal input to the gate of the transistor 104 (a control signal input to the terminal W). Then, when the transistor 104 is turned off by the control signal input to the gate of the transistor 104 (the control signal input to the terminal W), the signal potential is held in the capacitor 105. In this manner, data can be written to the memory cell 100c.

Here, the off-state current of the transistor 104 whose channel is formed in the oxide semiconductor layer is extremely low. Thus, the potential (the signal potential) of the one electrode of the capacitor 105 can be held for a long time even while power supply voltage is not supplied to the memory cell 100c. Consequently, the memory cell 100c can retain data even after supply of power supply voltage is stopped.

Then, reading of data from the memory cell 100c is described. Data retained in the memory cell 100c is read by detection of the signal potential held in the one electrode of the capacitor 105 (can also be referred to as the amount of electric charge corresponding to the signal potential) from the terminal B while the transistor 104 is turned on by the control signal input to the gate of the transistor 104 (the control signal input to the terminal W).

Note that the other electrode of the capacitor 105 can be electrically connected to the terminal C. A fixed potential (e.g., a low power supply potential such as a ground potential) can be input to the terminal C.

The above is the description of the method for driving the memory cell 100c.

When data is written to and read from each of the plurality of memory cells 100c included in the memory element 300 as described above, the memory element 300 can write and read plural pieces of data (configuration data).

(Variation of Memory Cell)

In Structure 1 of the memory cell, Structure 2 of the memory cell, or Structure 3 of the memory cell, the memory cell may further include a diode, a resistor, or a switch. For example, an analog switch, a transistor, or the like can be used as the switch. For example, in Structure 2 of the memory cell, the memory cell may further include a capacitor, and one of a pair of electrodes of the capacitor may be electrically connected to the gate of the transistor 102. A fixed potential (e.g., a low power supply potential such as a ground potential) can be input to the other of the pair of electrodes of the capacitor.

Note that the memory element 300 can include memory capacitance for storing plural sets of configuration data corresponding to the state of the logic element 310 (the kind of logic operation performed by the look-up table 312 and a connection relation selected by the selection circuit 314), and given one set of configuration data can be selected from the plural sets of configuration data so that the data can be stored in the configuration memory 311.

The above is one aspect of a programmable LSI in the present invention.

With such a structure, the memory element 300 can continue to hold a signal potential corresponding to data (configuration data) for a long time after supply of power supply voltage to the memory element 300 is stopped. In short, the memory element 300 can function like a nonvolatile memory.

In a programmable LSI including the memory element 300 and the plurality of logic elements 310, regular refresh operation of the memory element 300 is not needed or the frequency of refresh operation can be markedly decreased; thus, power consumption can be reduced. Further, it is not necessary to write data to the memory element 300 every time supply of power supply voltage to the programmable LSI is started. In this manner, it is possible to provide a low-power programmable LSI that can perform configuration (dynamic configuration) at high speed and can quickly start. Note that it is possible not to provide the memory element 300 when a nonvolatile storage circuit as described in Embodiment 1 is used as the configuration memory 311.

This embodiment can be combined with any of the other embodiments as appropriate.

(Embodiment 3)

In this embodiment, a more specific aspect of the memory element 300 in Embodiment 2 is described.

The memory element 300 can include a memory cell array including the plurality of memory cells in Embodiment 2

(having Structure 1 of the memory cell, Structure 2 of the memory cell, or Structure 3 of the memory cell) arranged in matrix.

The memory element 300 can include any of or all of a decoder (a row decoder or a column decoder), a precharge circuit, a sense amplifier, and a temporary storage circuit in addition to the memory cell array. Note that some of these circuits can be merged into a single circuit. For example, the sense amplifier may function as a temporary storage circuit.

The decoder (the row decoder or the column decoder) has a function of selecting a given memory cell in the memory cell array. The memory element 300 writes and reads data to and from the memory cell selected by the decoder (the row decoder or the column decoder). The precharge circuit has a function of setting (precharging) the potential of a bit line included in the memory cell array to a predetermined potential before data is read from the memory cell. Since data can be read from the memory cell after the potential of the bit line is set (precharged) to the predetermined potential by the precharge circuit, the speed of reading data from the memory cell can be increased. The sense amplifier has a function of amplifying the potential of the bit line that corresponds to data retained in the memory cell and outputting the amplified potential. Data can be read more quickly and accurately by the sense amplifier. The temporary storage circuit is also referred to as a page buffer or a latch circuit and has a function of temporarily retaining data input from the outside of the memory element. The temporary storage circuit may have a function of retaining data read from the memory cell array.

Figure 5A:
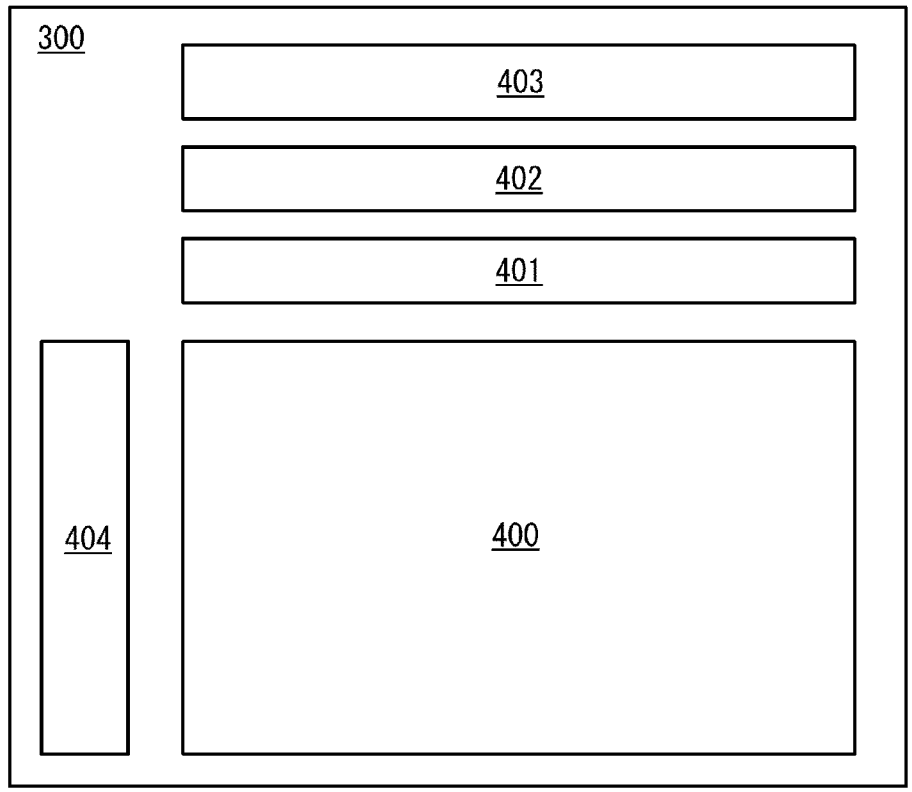
FIG. 5A is a block diagram of a memory element.
Figure 5B:
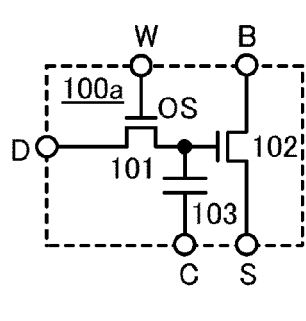
FIGS. 5B to 5D are circuit diagrams of memory cells.
Figure 5C:
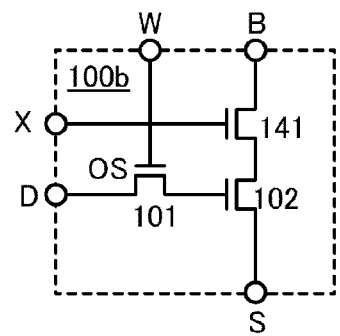
Figure 5D:
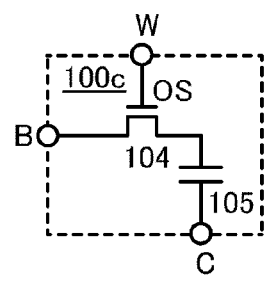

FIG. 5A schematically illustrates one aspect of the structure of the memory element 300. In FIG. 5A, the memory element 300 includes a memory cell array 400, a column decoder 403, a row decoder 404, a precharge circuit 402, and a sense amplifier 401.

Note that although FIG. 5A illustrates the structure where the precharge circuit 402 and the sense amplifier 401 are provided on a side of the memory cell array 400 where the column decoder 403 is provided, this embodiment is not limited to this structure. Either one or both the precharge circuit 402 and the sense amplifier 401 may be provided on a side that faces the column decoder 403 with the memory cell array 400 provided therebetween. The precharge circuit 402 and the sense amplifier 401 may be merged into a single circuit. The memory cell array 400 may be provided to overlap with a driver circuit (e.g., the column decoder 403, the row decoder 404, the precharge circuit 402, or the sense amplifier 401).

Note that the memory element 300 may further include any of or all of a diode, a resistor, an arithmetic circuit (an arithmetic element), and a switch. As the arithmetic circuit (the arithmetic element), a buffer, an inverter, a NAND circuit, a NOR circuit, a three-state buffer, a clocked inverter, or the like can be used. For example, an analog switch, a transistor, or the like can be used as the switch. Alternatively, an arithmetic circuit (an arithmetic element) to which either one or both a clock signal and an inversion signal of the clock signal are input can be used as the switch.

(Structure of Memory Cell Array)

A more specific aspect of the memory cell array 400 is described.

(Structure 1 of Memory Cell Array)

The memory cell array 400 can include the plurality of memory cells 100a described in Embodiment 2 with reference to FIG. 5B arranged in matrix. For example, the memory cell array 400 in FIG. 6 includes m×n (m is a natural number of 2 or more and n is a natural number of 2 or more) memory cells (memory cells 100a (i, j) (i is a natural number of m or less and j is a natural number of n or less)). Each of the m×n memory cells (the memory cells 100a (i,j)) can be the memory cell 100a in FIG. 5B.

Figure 6:
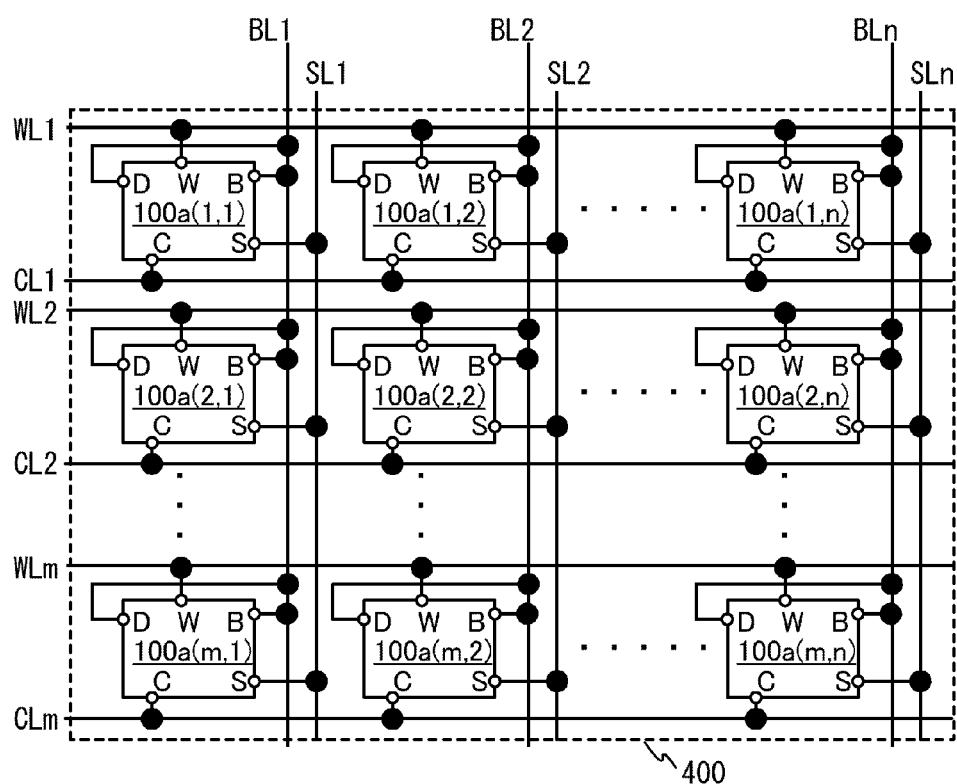
FIG. 6 is a circuit diagram of a memory cell array.

In FIG. 6, a wiring BLj that is electrically connected to the terminal B and the terminal D is used in common among the memory cells arranged in one column. For example, a wiring BL1 that is electrically connected to the terminal B and the terminal D is used in common among the memory cells arranged in a first column (the memory cells 100a (1, 1) to 100a (m, 1)). The wiring BLj can be referred to as a bit line.

In FIG. 6, a wiring SLj that is electrically connected to the terminal S is used in common among the memory cells arranged in one column. For example, a wiring SL1 that is electrically connected to the terminal S is used in common among the memory cells arranged in the first column (the memory cells 100a (1, 1) to 100a (m, 1)). Note that the wiring SLj that is electrically connected to the terminal S can be used in common among all the memory cells that are included in the memory cell array.

In FIG. 6, a wiring WLi that is electrically connected to the terminal W is used in common among the memory cells arranged in one row. For example, a wiring WL1 that is electrically connected to the terminal W is used in common among the memory cells arranged in a first row (the memory cells 100a (1, 1) to 100a (1, n)). The wiring WLi can also be referred to as a write word line.

In FIG. 6, a wiring CLi that is electrically connected to the terminal C is used in common among the memory cells arranged in one row. For example, a wiring CL1 that is electrically connected to the terminal C is used in common among the memory cells arranged in the first row (the memory cells 100a (1, 1) to 100a (1, n)). The wiring CLi can also be referred to as a read word line.

However, this embodiment is not limited to this structure. The plurality of wirings BLj and the plurality of wirings SLj may be provided in the memory cells arranged in one column, or the plurality of wirings WLi and the plurality of wirings CLi may be provided in the memory cells arranged in one row.

The wirings can be used in common in the structure in FIG. 6. When the wirings are used in common, the memory cell array 400 can be miniaturized and highly integrated.

In the memory cell array 400 in FIG. 6, data is selectively written to the memory cell (the memory cell 100a (i, j)) in a row specified by a signal input to the wiring WLi. Specifically, the transistors 101 in the memory cells electrically connected to the wiring BLj other than the storage element to which data is written are turned off and the transistor 101 in the memory cell to which data is written is turned on by a signal input to the wiring WLi. In this manner, the data is written to the specified memory cell. Further, the data is selectively read from the memory cell (the memory cell 100a (i,j)) in a row specified by a signal input to the wiring CLi. Specifically, the transistors 102 in the memory cells electrically connected to the wiring BLj other than the memory cell from which data is read are turned off (regardless of data retained) and the state of the transistor 102 in the memory cell from which data is read is changed in accordance with the data (the signal potential) retained. In this manner, the data is read from the specified memory cell. Note that a method for writing and reading data to and from a specified memory cell is similar to the method for driving the memory cell 100a in the above embodiment; thus, description thereof is omitted.

(Structure 2 of Memory Cell Array)

The memory cell array 400 can include the plurality of memory cells 100a described in Embodiment 2 with reference to FIG. 5B arranged in matrix. For example, the memory cell array 400 in FIG. 9B includes m×n (m is a natural number of 2 or more and n is a natural number of 2 or more) memory cells (memory cells 100a (i, A (i is a natural number of m or less and j is a natural number of n or less)). Each of the m×n memory cells (the memory cells 100a (i,j)) can be the memory cell 100a in FIG. 5B.

Figure 9A:
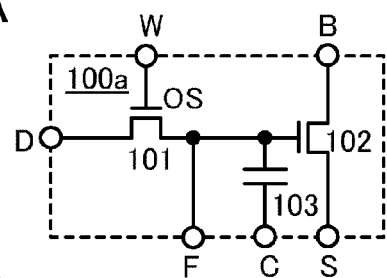
FIGS. 9A and 9B are circuit diagrams of a memory cell array.
Figure 9B:
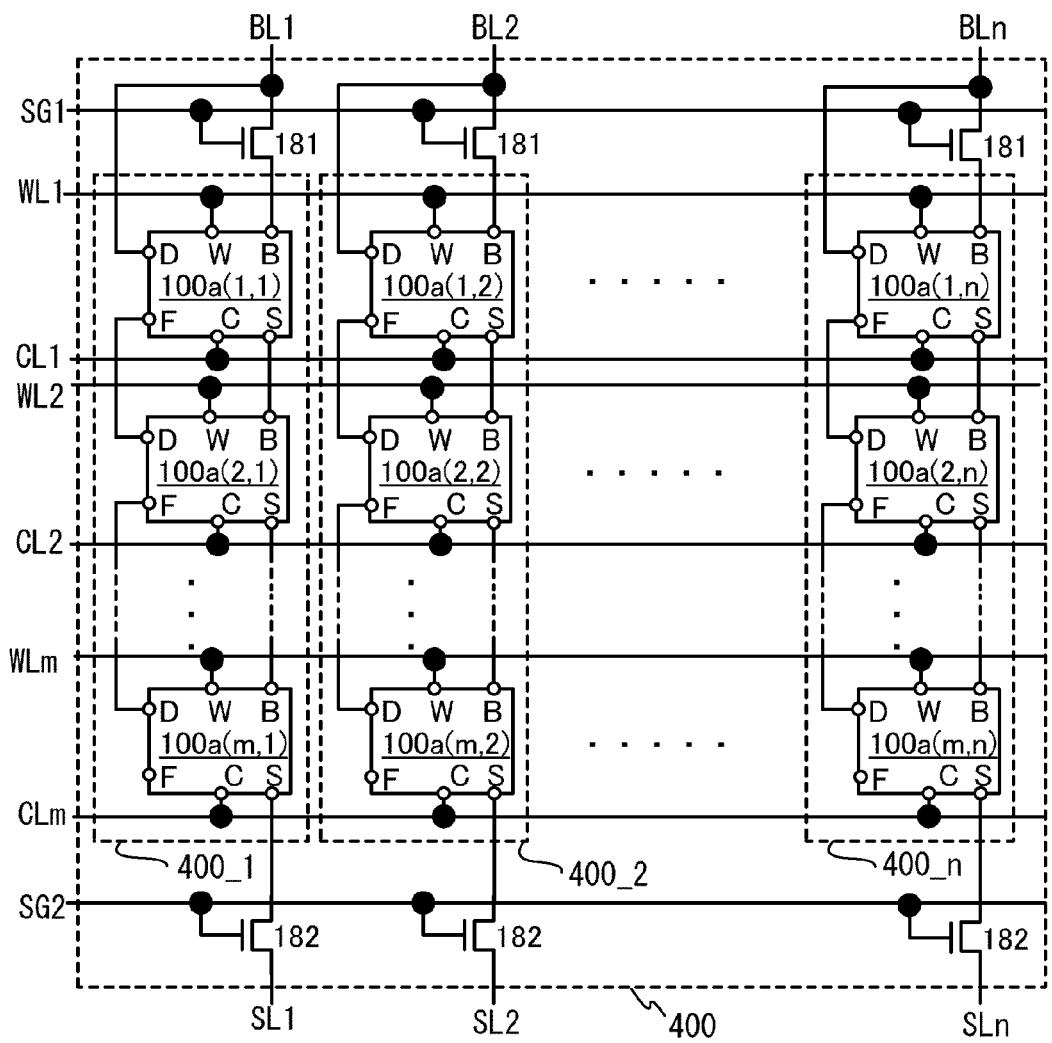

In the structure in FIG. 9B, in a memory cell positioned at one end of a memory cell group 400_j (the memory cell 100a (1, j)), the terminal D is electrically connected to the wiring BLj, and the terminal B is electrically connected to the wiring BLj through a transistor 181 functioning as a switch. In a memory cell positioned at the other end of the memory cell group 400_j (the memory cell 100a (m, j)), the terminal S is electrically connected to the wiring SLj through a transistor 182 functioning as a switch. Note that the transistor 182 may be eliminated and the terminal S may be directly connected to the wiring SLj in the memory cell positioned at the other end of the memory cell group 400_j (the memory cell 100a (m, j)). In the memory cells other than the memory cells positioned at the ends of the memory cell group 400_j, the terminal S of one of adjacent memory cells is electrically connected to the terminal B of the other of the adjacent memory cells, and the terminal F of the one of the adjacent memory cells is electrically connected to the terminal D of the other of the adjacent memory cells. Here, as illustrated in FIG. 9A, the terminal F is a terminal provided in a node that is electrically connected to the gate of the transistor 102. Thus, in the structure in FIG. 9B, the transistors 102 included in the memory cell group 400_j can be regarded as being electrically connected in series and the transistors 101 included in the memory cell group 400_j can be regarded as being electrically connected in series. The wiring BLj can also be referred to as a bit line.

In FIG. 9B, the wiring WLi that is electrically connected to the terminal W is used in common among the memory cells arranged in one row. For example, the wiring WL1 that is electrically connected to the terminal W is used in common among the memory cells arranged in a first row (the memory cells 100a (1, 1) to 100a (1, n)). The wiring WLi can also be referred to as a write word line.

In FIG. 9B, the wiring CLi that is electrically connected to the terminal C is used in common among the memory cells arranged in one row. For example, the wiring CL1 that is electrically connected to the terminal C is used in common among the memory cells arranged in the first row (the memory cells 100a (1, 1) to 100a (1, n)). The wiring CLi can also be referred to as a read word line.

However, this embodiment is not limited to this structure. The plurality of wirings WLi and the plurality of wirings CLi may be provided in the memory cells arranged in one row.

The wirings can be used in common in the structure in FIG. 9B. When the wirings are used in common, the memory cell array 400 can be miniaturized and highly integrated.

Note that although FIG. 9B illustrates the structure of the memory cell array 400 in which the memory cell group 400_j is provided for one row, this embodiment is not limited to this structure. In the memory cell array 400, the memory cell groups 400_j may be arranged in matrix.

In the memory cell array 400 in FIG. 9B, data is selectively written to the memory cell (the memory cell 100a (i, j)) in a row specified by a signal input to the wiring WLi. Specifically, data is sequentially written to the memory cells from the memory cell on a side closer to the wiring SLj. The transistors 101 in the memory cell to which data is written and all the memory cells provided on a side closer to the wiring BLj than the memory cell are turned on by a signal input to the wiring WLi. Further, the transistors 101 in all the memory cells provided on a side closer to the wiring SLj than the memory cell to which data is written are turned off by a signal input to the wiring WLi. In this manner, a signal potential corresponding to data is input from the wiring BLj to the memory cell to which data is written. Note that either one or both the transistors 181 and 182 are off while data is written. Further, the data is selectively read from the memory cell (the memory cell 100a (i, j)) in a row specified by a signal input to the wiring CLi. Specifically, the transistors 102 in the memory cells electrically connected to the wiring BLj other than the memory cell from which data is read are turned on (regardless of data retained) and the state of the transistor 102 in the memory cell from which data is read is changed in accordance with the data (the signal potential) retained. Note that the transistors 181 and 182 are on while data is read. In this manner, the data is read from the specified memory cell. Note that a method for writing and reading data to and from a specified memory cell is similar to the method for driving the memory cell 100a in the above embodiment; thus, description thereof is omitted.

(Structure 3 of Memory Cell Array)

The memory cell array 400 can include the plurality of memory cells 100b described in Embodiment 2 with reference to FIG. 5C arranged in matrix. For example, the memory cell array 400 in FIG. 7 includes m×n (m is a natural number of 2 or more and n is a natural number of 2 or more) memory cells (memory cells 100b (i, j) (i is a natural number of m or less and j is a natural number of n or less)). Each of the m×n memory cells (the memory cells 100b (i,j)) can be the memory cell 100b in FIG. 5C.

Figure 7:
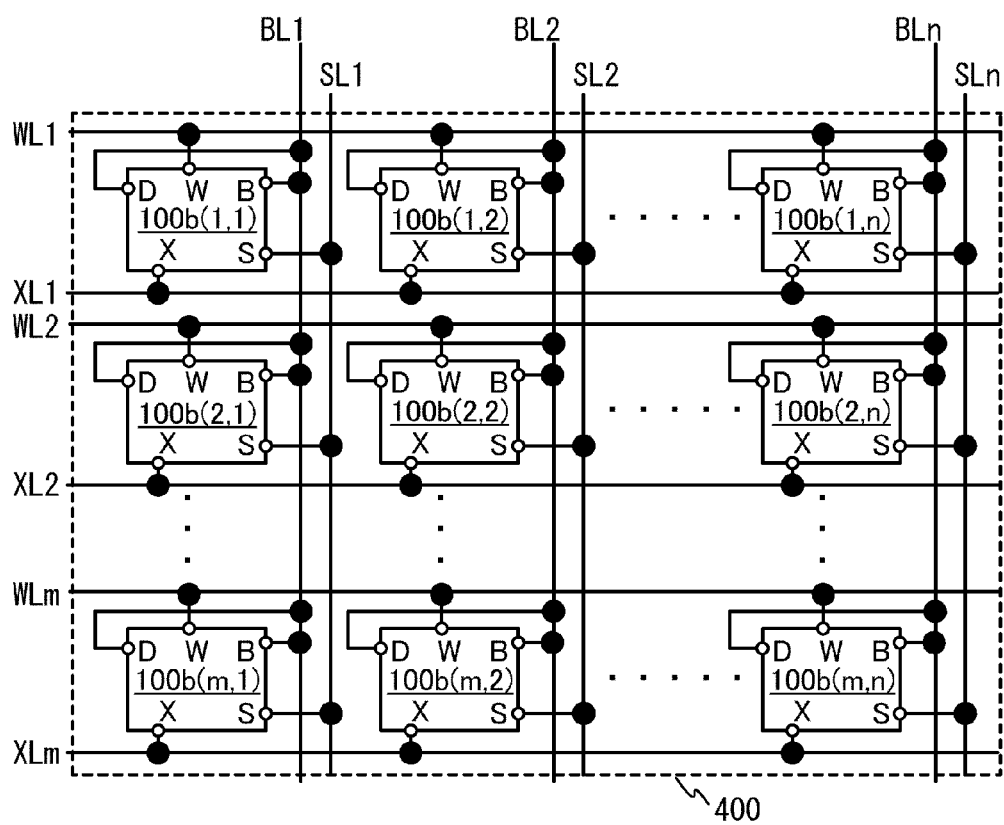
FIG. 7 is a circuit diagram of a memory cell array.

In FIG. 7, the wiring BLj that is electrically connected to the terminal B and the terminal D is used in common among the memory cells arranged in one column. For example, the wiring BL1 that is electrically connected to the terminal B and the terminal D is used in common among the memory cells arranged in a first column (the memory cells 100b (1, 1) to 100b (m, 1)). The wiring BLj can be referred to as a bit line.

In FIG. 7, the wiring SLj that is electrically connected to the terminal S is used in common among the memory cells arranged in one column. For example, the wiring SL1 that is electrically connected to the terminal S is used in common among the memory cells arranged in the first column (the memory cells 100b (1, 1) to 100b (m, 1)). Note that the wiring SLj that is electrically connected to the terminal S can be used in common among all the memory cells that are included in the memory cell array.

In FIG. 7, the wiring WLi that is electrically connected to the terminal W is used in common among the memory cells arranged in one row. For example, the wiring WL1 that is electrically connected to the terminal W is used in common among the memory cells arranged in a first row (the memory cells 100b (1, 1) to 100b (1, n)). The wiring WLi can also be referred to as a write word line.

In FIG. 7, a wiring XLi that is electrically connected to the terminal X is used in common among the memory cells arranged in one row. For example, a wiring XL1 that is electrically connected to the terminal X is used in common among the memory cells arranged in the first row (the memory cells 100b (1, 1) to 100b (1, n)). The wiring XLi can also be referred to as a read word line.

However, this embodiment is not limited to this structure. The plurality of wirings BLj and the plurality of wirings SLj may be provided in the memory cells arranged in one column, or the plurality of wirings WLi and the plurality of wirings XLi may be provided in the memory cells arranged in one row.

The wirings can be used in common in the structure in FIG. 7. When the wirings are used in common, the memory cell array 400 can be miniaturized and highly integrated.

In the memory cell array 400 in FIG. 7, data is selectively written to the memory cell (the memory cell 100b (i, j)) in a row specified by a signal input to the wiring WLi. Specifically, the transistors 101 in the memory cells electrically connected to the wiring BLj other than the memory cell to which data is written are turned off and the transistor 101 in the memory cell to which data is written is turned on by a signal input to the wiring WLi. In this manner, the data is selectively written. Further, the data is selectively read from the memory cell (the memory cell 100b (i, j)) in a row specified by a signal input to the wiring XLi. Specifically, the transistors 141 in the memory cells electrically connected to the wiring BLj other than the memory cell from which data is read are turned off and the transistor 141 in the memory cell from which data is read is turned on. In this manner, the data is selectively read. Note that a method for writing and reading data to and from a specified memory cell is similar to the method for driving the memory cell 100b in the above embodiment; thus, description thereof is omitted.

(Structure 4 of Memory Cell Array)

The memory cell array 400 can include the plurality of memory cells 100c described in Embodiment 2 with reference to FIG. 5D arranged in matrix. For example, the memory cell array 400 in FIG. 8 includes m×n (m is a natural number of 2 or more and n is a natural number of 2 or more) memory cells (memory cells 100c (i, j) (i is a natural number of m or less and j is a natural number of n or less)). Each of the m×n memory cells (the memory cells 100c (i,j)) can be the memory cell 100c in FIG. 5D.

Figure 8:
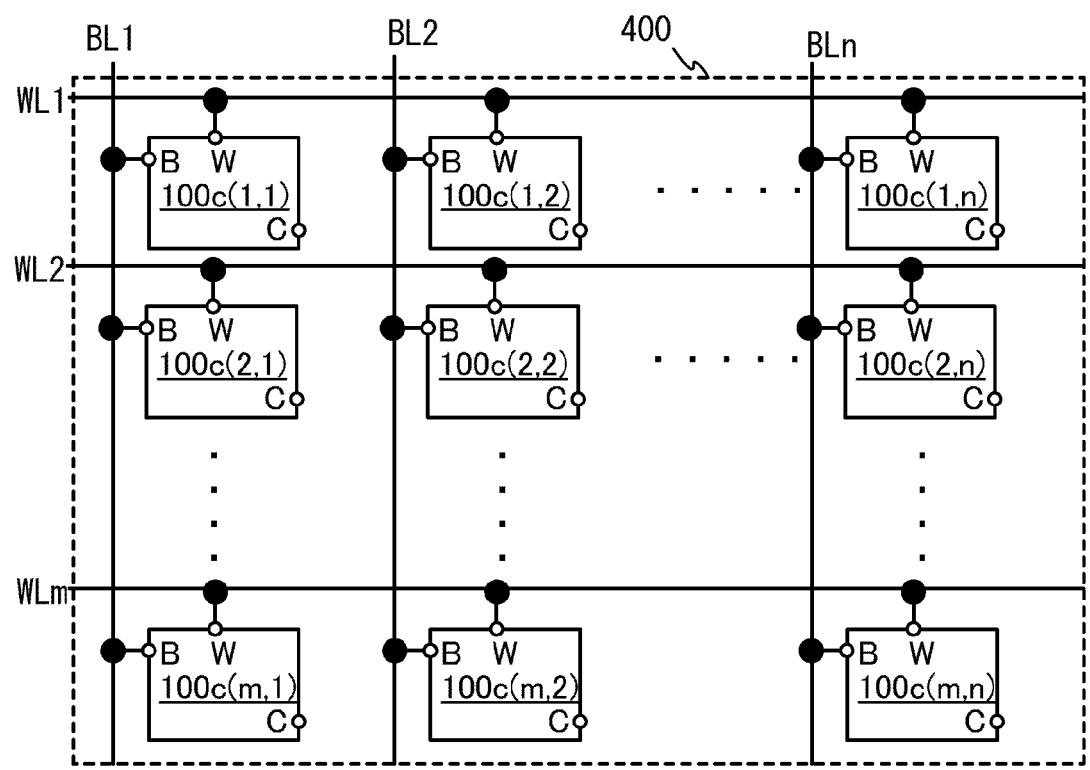
FIG. 8 is a circuit diagram of a memory cell array.

In FIG. 8, the wiring BLj that is electrically connected to the terminal B is used in common among the memory cells arranged in one column. For example, the wiring BL1 that is electrically connected to the terminal B is used in common among the memory cells arranged in a first column (the memory cells 100c (1, 1) to 100c (m, 1)). The wiring BLj can be referred to as a bit line.

In FIG. 8, the wiring WLi that is electrically connected to the terminal W is used in common among the memory cells arranged in one row. For example, the wiring WL1 that is electrically connected to the terminal W is used in common among the memory cells arranged in a first row (the memory cells 100c (1, 1) to 100c (1, n)). The wiring WLi can also be referred to as a word line.

However, this embodiment is not limited to this structure. The plurality of wirings BLj may be provided in the memory cells arranged in one column, or the plurality of wirings WLi may be provided in the memory cells arranged in one row. In the m×n memory cells (the memory cells 100c (i, j)), the terminals C may be electrically connected to one electrode or one wiring or may be electrically connected to different electrodes or different wirings.

The wirings can be used in common in the structure in FIG. 8. When the wirings are used in common, the memory cell array 400 can be miniaturized and highly integrated.

In the memory cell array 400 in FIG. 8, data is selectively written to and read from the memory cell (the memory cell 100c (i, j)) in a row specified by a signal input to the wiring WLi. Specifically, the transistors 104 in the memory cells other than the memory cell to which data is written are turned off and the transistor 104 in the memory cell to which data is written is turned on by a signal input to the wiring WLi; thus, the data is selectively written. Further, the transistors 104 in the memory cells other than the memory cell from which data is read are turned off and the transistor 104 in the memory cell from which data is read is turned on; thus, the data is selectively read. A method for writing and reading data to and from a specified memory cell is similar to the method for driving the memory cell 100c in the above embodiment; thus, description thereof is omitted.

(Variation of Memory Cell Array)

Note that in Structure 1 of the memory cell array, Structure 2 of the memory cell array, Structure 3 of the memory cell array, or Structure 4 of the memory cell array, the memory cell array may further include any of or all of a diode, a resistor, an arithmetic circuit (an arithmetic element), and a switch. As the arithmetic circuit (the arithmetic element), a buffer, an inverter, a NAND circuit, a NOR circuit, a three-state buffer, a clocked inverter, or the like can be used. For example, an analog switch, a transistor, or the like can be used as the switch. Alternatively, an arithmetic circuit (an arithmetic element) to which either one or both a clock signal and an inversion signal of the clock signal are input can be used as the switch.

Note that the memory element 300 can include memory capacitance for storing plural sets of configuration data corresponding to the state of the logic element 310 (the kind of logic operation performed by the look-up table 312 and a connection relation selected by the selection circuit 314), and given one set of configuration data can be selected from the plural sets of configuration data so that the data can be stored in the configuration memory 311. In that case, when one set of configuration data is stored in the memory cells provided in one row of the memory cell array 400, the one set of configuration data can be read from one row. Thus, the configuration time can be shortened.

(Structure of Sense Amplifier)

Next, a specific aspect of the structure of the sense amplifier 401 in FIG. 5A is described. The sense amplifier 401 can include a plurality of sense amplifiers. The sense amplifier can be provided per bit line provided in the memory cell array 400. The potential of the bit line can be amplified by the sense amplifier and can be detected from an output terminal of the sense amplifier. Here, the potential of the bit line is based on a signal potential held in a memory cell that is electrically connected to the bit line and from which data is read. Thus, a signal output from the output terminal of the sense amplifier corresponds to data retained in the memory cell from which data is read. In this manner, data retained in each memory cell in the memory cell array 400 can be detected by the sense amplifier 401.

The sense amplifier can be formed using an inverter or a buffer. For example, the sense amplifier can be formed using a latch circuit (a latch sense amplifier). Alternatively, the sense amplifier can be formed using a comparator. For example, the sense amplifier can be formed using a differential amplifier (an operational amplifier).

In particular, in the case where the memory cell 100c with the structure in FIG. 5D is used as the memory cell included in the memory cell array 400, it is preferable to use a latch sense amplifier as the sense amplifier 401. The latch sense amplifier can amplify an input signal and can hold the amplified signal. Thus, even when electric charge corresponding to a signal potential held in the capacitor 105 in the memory cell 100c is changed (damaged) at the time of reading data from the memory cell 100c, a signal corresponding to the signal potential can be held in the latch sense amplifier and can be written to the memory cell 100c again.

A more specific aspect of the sense amplifier 401 is described with reference to FIGS. 11A to 11D and FIGS. 12A to 12G

(Structure 1 of Sense Amplifier)

Figure 11A:
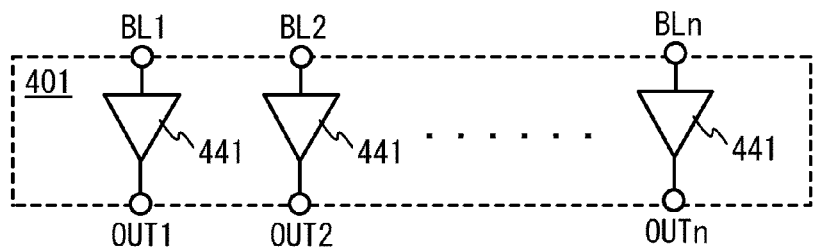
FIGS. 11A to 11D are circuit diagrams of a sense amplifier.

FIG. 11A illustrates an example of the sense amplifier 401 including buffers 441. The sense amplifier 401 includes the n buffers 441, and the n buffers 441 are provided for bit lines BL1 to BLn in the memory cell array 400. The potentials of the bit lines BL1 to BLn can be amplified by the n buffers 441 and can be output from output terminals OUT1 to OUTn. Here, the potential of the bit line is based on a signal potential held in a memory cell that is electrically connected to the bit line and from which data is read. Thus, a signal output from the output terminal of the buffer 441 corresponds to data retained in the memory cell from which data is read. In this manner, data retained in each memory cell in the memory cell array 400 can be detected by the sense amplifier 401 including the n buffers 441.

(Structure 2 of Sense Amplifier)

Figure 11B:
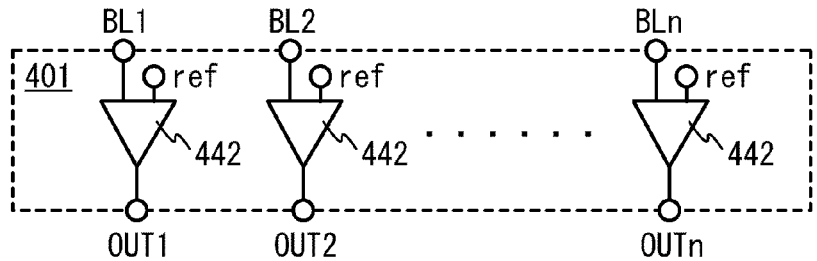

FIG. 11B illustrates an example of the sense amplifier 401 including comparators 442. The sense amplifier 401 includes the n comparators 442, and the n comparators 442 are provided for the bit lines BL1 to BLn in the memory cell array 400. The potentials of the bit lines BL1 to BLn can be compared to a reference potential (indicated by "ref" in FIG. 11B) by the n comparators 442 and the comparison results can be output from output terminals OUT1 to OUTn. Here, the potential of the bit line is based on a signal potential held in a memory cell that is electrically connected to the bit line and from which data is read. Thus, a signal output from the output terminal of the comparator 442 corresponds to data retained in the memory cell from which data is read. In this manner, data retained in each memory cell in the memory cell array 400 can be detected by the sense amplifier 401 including the n comparators 442.

(Structure 3 of Sense Amplifier)

Figure 11C:
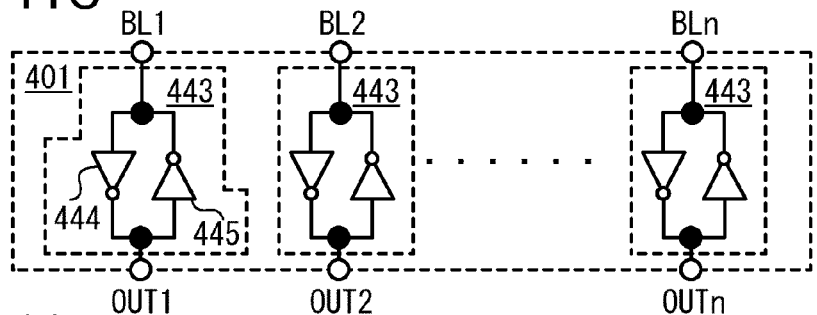
Figure 11D:
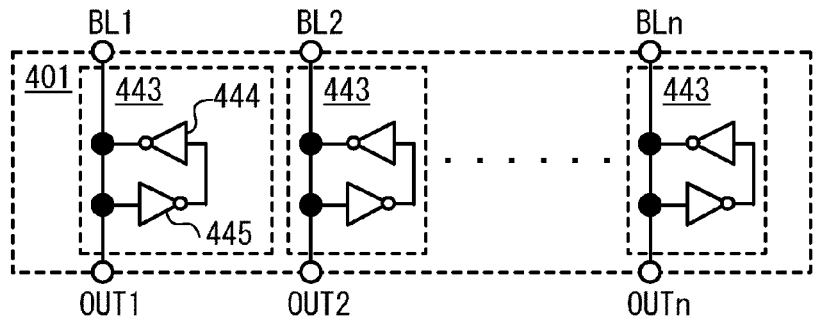

FIGS. 11C and 11D each illustrate an example of the sense amplifier 401 including latch circuits 443. The latch circuit 443 can be formed using an inverter 444 and an inverter 445, for example. The sense amplifier 401 includes the n latch circuits 443, and the n latch circuits 443 are provided for the bit lines BL1 to BLn in the memory cell array 400. The potentials of the bit lines BL1 to BLn can be amplified by the n latch circuits 443 and can be output from output terminals OUT1 to OUTn. Here, the potential of the bit line is based on a signal potential held in a memory cell that is electrically connected to the bit line and from which data is read. Thus, a signal (an amplified signal) output from the output terminal of the latch circuit 443 corresponds to data retained in the memory cell from which data is read. In this manner, data retained in each memory cell in the memory cell array 400 can be detected by the sense amplifier 401 including the n latch circuits 443.

Further, each of the n latch circuits 443 can hold an amplified signal. Thus, even when data is damaged at the time of reading the data from the memory cell in the memory cell array 400, a corresponding signal can be held in the n latch circuits 443 and can be written to the memory cell again.

For example, in the case where the memory cell 100c with the structure in FIG. 5D is used as the memory cell included in the memory cell array 400, it is preferable to use the sense amplifier 401 with the structure in FIG. 11C or 11D. Even when electric charge corresponding to a signal potential held in the capacitor 105 in the memory cell 100c is changed (damaged) at the time of reading data from the memory cell 100c, a signal corresponding to the signal potential can be held in the latch circuit 443 and can be written to the memory cell 100c again. Note that the signal held in the latch circuit 443 can be written to the memory cell 100c again through an arithmetic element such as an inverter.

Since the sense amplifier 401 that includes the latch circuit 443 as illustrated in FIG. 11C or 11D has a function of holding a signal as described above, the sense amplifier 401 can be used as a temporary storage circuit. For example, the sense amplifier 401 that includes the latch circuit 443 can be used as a circuit (e.g., a page buffer) for temporarily retaining data input from the outside of the memory element 300.

(Variation of Sense Amplifier)

Note that the sense amplifier may further include any of or all of a diode, a resistor, an arithmetic circuit (an arithmetic element), and a switch. As the arithmetic circuit (the arithmetic element), a buffer, an inverter, a NAND circuit, a NOR circuit, a three-state buffer, a clocked inverter, or the like can be used. For example, an analog switch, a transistor, or the like can be used as the switch. Alternatively, an arithmetic circuit (an arithmetic element) to which either one or both a clock signal and an inversion signal of the clock signal are input can be used as the switch.

Figure 12A:
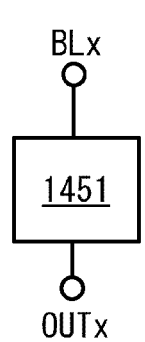
FIGS. 12A to 12G are circuit diagrams of a sense amplifier.

FIG. 12A schematically illustrates the structure of each sense amplifier in the sense amplifier 401 described with reference to FIGS. 11A to 11D. A sense amplifier 1451 corresponds to the buffer 441 in FIG. 11A, the comparator 442 in FIG. 11B, or the latch circuit 443 in FIG. 11C or 11D. The symbol BLx indicates any one of the bit lines BL1 to BLn, and the symbol OUTx indicates any one of the output terminals OUT1 to OUTn. A diode, a resistor, an arithmetic circuit (an arithmetic element), or a switch can be added to the sense amplifier with the structure in FIG. 12A.

Figure 12B:
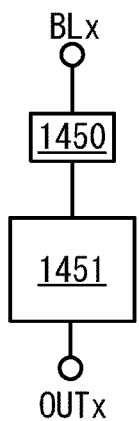

As illustrated in FIG. 12B, an element 1450 may be provided between the bit line BLx and the sense amplifier 1451. A switch can be used as the element 1450, for example.

Figure 12C:
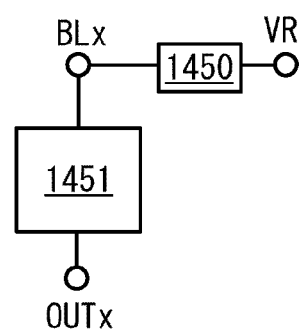

As illustrated in FIG. 12C, a terminal VR may be electrically connected to the bit line BLx through the element 1450. A switch, a resistor, or a diode can be used as the element 1450, for example.

Figure 12D:
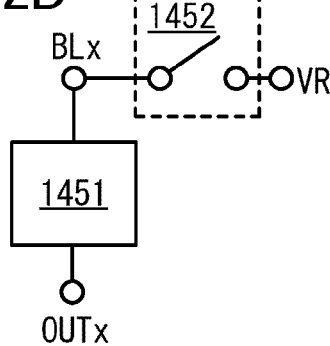

FIG. 12D is an example in which a switch 1452 is provided as the element 1450 in FIG. 12C. FIG. 12F is an example in which a transistor whose gate is supplied with a control signal PSW is used as the switch 1452. In the structure in FIG. 12D or 12F, when the switch 1452 is turned on by application of a predetermined potential to the terminal VR, the predetermined potential can be precharged to the bit line BLx. In this manner, the sense amplifier 401 can also be used as the precharge circuit 402.

Figure 12E:
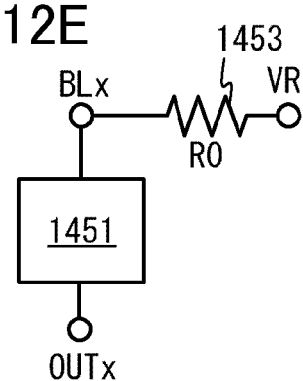
Figure 12F:
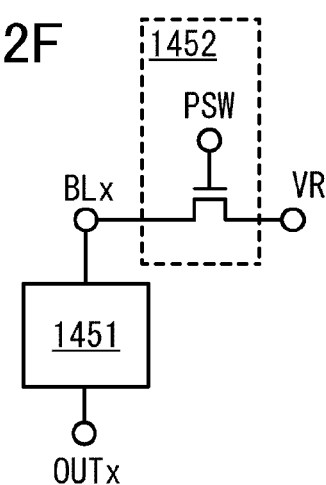
Figure 12G:
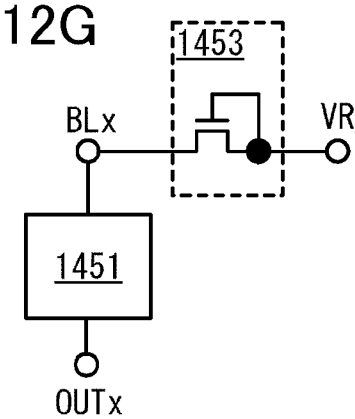

FIG. 12E is an example in which a load 1453 is provided as the element 1450 in FIG. 12C. FIG. 12G is an example in which a diode-connected transistor is used as the load 1453. In the structure in FIG. 12E or 12G, in the case where the transistor 102 is off by a signal potential held at the time of reading data from the memory cell 100a in FIG. 5B or the memory cell 100b in FIG. 5C, the potential of the terminal VR can be input to the sense amplifier.

(Structure of Precharge Circuit)

Figure 10:
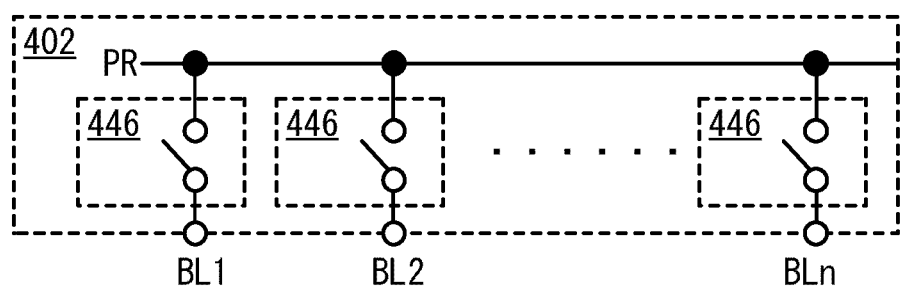
FIG. 10 is a circuit diagram of a precharge circuit.

Next, a specific aspect of the precharge circuit 402 in FIG. 5A is described with reference to FIG. 10. In FIG. 10, the precharge circuit 402 includes a precharge line PR and a plurality of switches 446. The switches 446 can be provided for the bit lines BL1 to BLn in the memory cell array 400. An electrical connection between each bit line and the precharge line PR is selected by each switch 446, and the potential (the precharge potential) of the precharge line PR can be input to each bit line. For example, an analog switch, a transistor, or the like can be used as the switch 446. Alternatively, an arithmetic circuit (an arithmetic element) to which either one or both a clock signal and an inversion signal of the clock signal are input can be used as the switch 446.

Note that the precharge circuit 402 may further include any of or all of a diode, a resistor, an arithmetic circuit (an arithmetic element), and a different switch. As the arithmetic circuit (the arithmetic element), a buffer, an inverter, a NAND circuit, a NOR circuit, a three-state buffer, a clocked inverter, or the like can be used.

The above is the description of variations of the memory element.

This embodiment can be combined with any of the other embodiments as appropriate.

(Embodiment 4)

In this embodiment, one aspect of the look-up table 312 included in the logic element 310 is described. The look-up table 312 can be formed using a plurality of multiplexers. Further, configuration data can be input to any of input terminals and control terminals of the plurality of multiplexers.

Figure 3A:
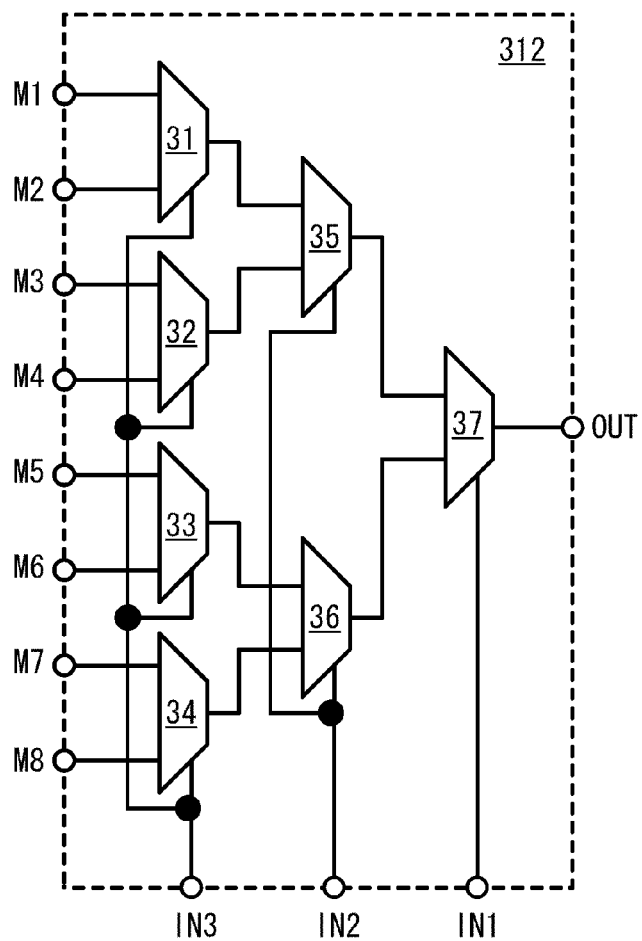
FIGS. 3A to 3C are circuit diagrams of a look-up table.

FIG. 3A illustrates one aspect of the look-up table 312 included in the logic element 310.

In FIG. 3A, the look-up table 312 is formed using seven two-input multiplexers (a multiplexer 31, a multiplexer 32, a multiplexer 33, a multiplexer 34, a multiplexer 35, a multiplexer 36, and a multiplexer 37). Input terminals of the multiplexers 31 to 34 correspond to input terminals M1 to M8 of the look-up table 312. Control terminals of the multiplexers 31 to 34 are electrically connected to each other and correspond to an input terminal IN3 of the look-up table 312. Output terminals of the multiplexers 31 and 32 are electrically connected to two input terminals of the multiplexer 35. Output terminals of the multiplexers 33 and 34 are electrically connected to two input terminals of the multiplexer 36. Control terminals of the multiplexers 35 and 36 are electrically connected to each other and correspond to an input terminal IN2 of the look-up table 312. Output terminals of the multiplexers 35 and 36 are electrically connected to two input terminals of the multiplexer 37. A control terminal of the multiplexer 37 corresponds to an input terminal IN1 of the look-up table 312. An output terminal of the multiplexer 37 corresponds to an output terminal OUT of the look-up table 312.

When configuration data is input from each storage circuit in the configuration memory 311 to any of the input terminals M1 to M8 and IN1 to IN3, the kind of arithmetic processing performed by the look-up table 312 can be specified.

Figure 3B:
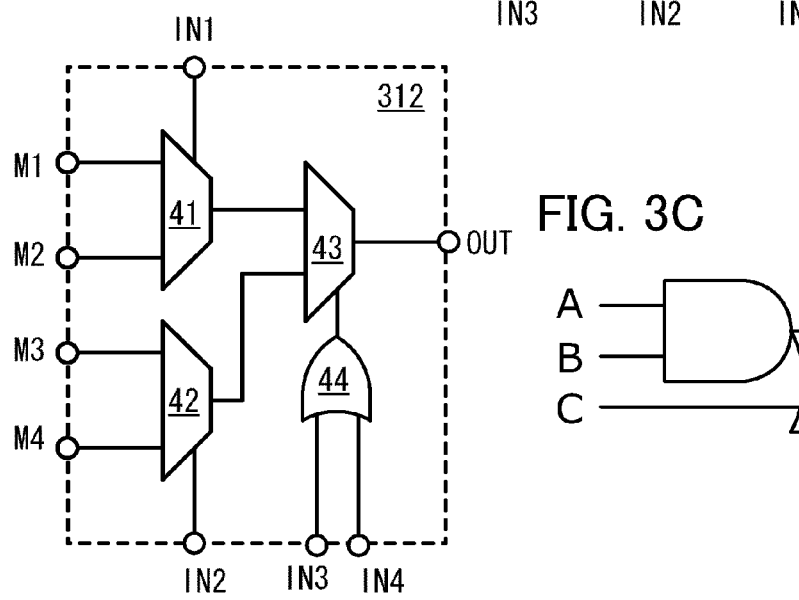
Figure 3C:
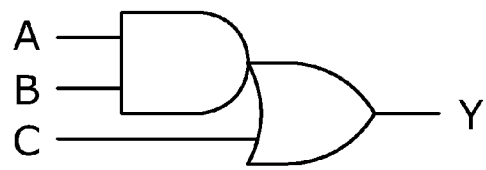

For example, in the case where data ("0", "1", "0", "1", "0", "1", "1", and "1") is input to the input terminals M1 to M8 of the look-up table 312 in FIG. 3A, the function of an equivalent circuit in FIG. 3C can be obtained. Here, "A", "B", and "C" are assigned to the input terminals IN1 to IN3, and "Y" is assigned to the output terminal OUT.

FIG. 3B illustrates another aspect of the look-up table 312 included in the logic element 310.

In FIG. 3B, the look-up table 312 is formed using three two-input multiplexers (a multiplexer 41, a multiplexer 42, and a multiplexer 43) and a two-input OR circuit 44. Input terminals of the multiplexers 41 and 42 correspond to the input terminals M1 to M4 of the look-up table 312. A control terminal of the multiplexer 41 corresponds to the input terminal IN1 of the look-up table 312. A control terminal of the multiplexer 42 corresponds to the input terminal IN2 of the look-up table 312. Output terminals of the multiplexers 41 and 42 are electrically connected to two input terminals of the multiplexer 43. Two input terminals of the OR circuit 44 correspond to the input terminal IN 3 and an input terminal IN4 of the look-up table 312, and an output of the OR circuit 44 is input to a control terminal of the multiplexer 43. An output terminal of the multiplexer 43 corresponds to the output terminal OUT of the look-up table 312.

When configuration data is input from each storage circuit in the configuration memory 311 to any of the input terminals M1 to M4 and IN1 to IN4, the kind of arithmetic processing performed by the look-up table 312 can be specified.

For example, in the case where data ("0", "1", "0", "0", and "0") is input to the input terminals M1, M3, M4, IN2, and IN4 of the look-up table 312 in FIG. 3B, the function of the equivalent circuit in FIG. 3C can be obtained. Here, "A", "B", and "C" are assigned to the input terminals IN1, M2, and IN3, and "Y" is assigned to the output terminal OUT.

Note that although FIGS. 3A and 3B each illustrate the example of the look-up table formed using two-input multiplexers, this embodiment is not limited thereto. It is possible to use a look-up table formed using multiplexers each having three or more inputs.

Note that the look-up table may further include any of or all of a diode, a resistor, an arithmetic circuit (an arithmetic element), and a switch in addition to the multiplexers. As the arithmetic circuit (the arithmetic element), a buffer, an inverter, a NAND circuit, a NOR circuit, a three-state buffer, a clocked inverter, or the like can be used. For example, an analog switch, a transistor, or the like can be used as the switch. Alternatively, an arithmetic circuit (an arithmetic element) to which either one or both a clock signal and an inversion signal of the clock signal are input can be used as the switch.

Although the case where three-input and one-output arithmetic processing as illustrated in FIG. 3C is performed using the look-up table 312 in FIG. 3A or FIG. 3B, this embodiment is not limited thereto. When the look-up table and configuration data to be input are determined as appropriate, arithmetic processing having four or more inputs and two or more outputs can be performed.

This embodiment can be combined with any of the other embodiments as appropriate.

(Embodiment 5)

In this embodiment, one aspect of the selection circuit 314 included in the logic element 310 is described. The selection circuit 314 can be formed using a multiplexer or a switch. Further, configuration data can be input to a control terminal of the multiplexer or the switch.

Figure 4A:
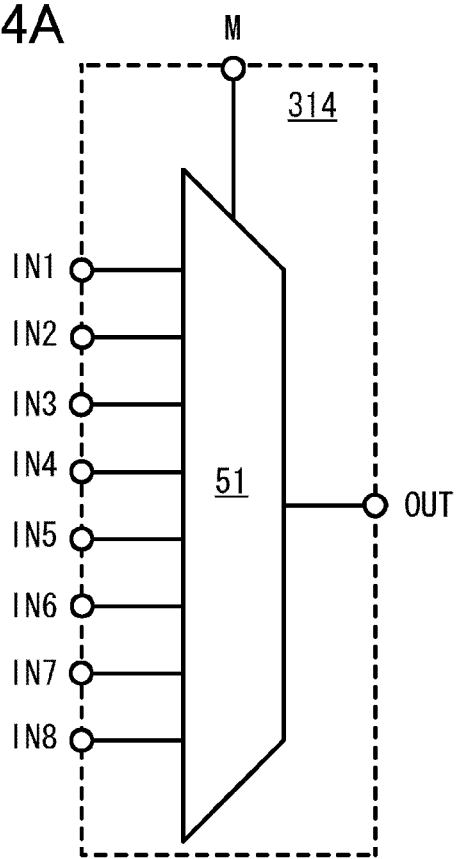
FIGS. 4A and 4B are circuit diagrams of a selection circuit.

FIG. 4A illustrates one aspect of the selection circuit 314 included in the logic element 310.

In FIG. 4A, the selection circuit 314 is formed using an eight-input multiplexer 51. When 3-bit configuration data is input to a control terminal M, any of signals input to input terminals IN1 to IN8 of the multiplexer 51 can be selectively output from an output terminal OUT.

Note that although FIG. 4A illustrates the example of the selection circuit formed using an eight-input multiplexer, this embodiment is not limited thereto. It is possible to use a selection circuit formed using a multiplexer having nine or more inputs. The selection circuit may further include any of or all of a diode, a resistor, an arithmetic circuit (an arithmetic element), and a switch in addition to the multiplexer. As the arithmetic circuit (the arithmetic element), a buffer, an inverter, a NAND circuit, a NOR circuit, a three-state buffer, a clocked inverter, or the like can be used. For example, an analog switch, a transistor, or the like can be used as the switch. Alternatively, an arithmetic circuit (an arithmetic element) to which either one or both a clock signal and an inversion signal of the clock signal are input can be used as the switch.

Figure 4B:
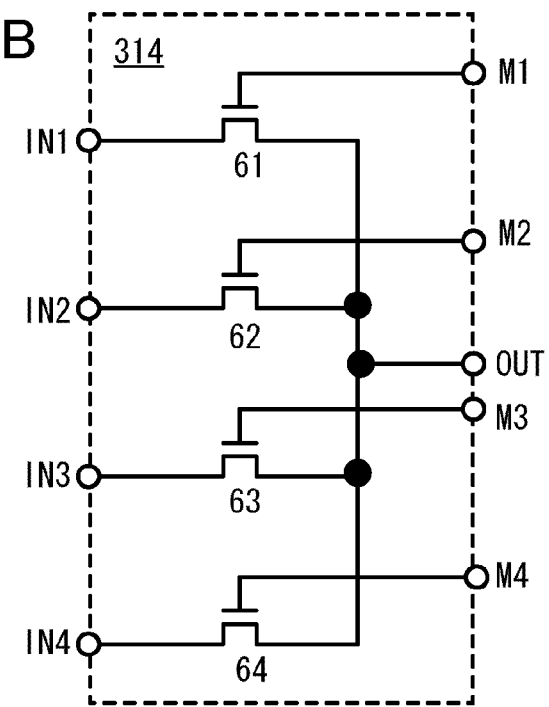

FIG. 4B illustrates another aspect of the selection circuit 314 included in the logic element 310.

In FIG. 4B, the selection circuit 314 includes transistors 61 to 64 each functioning as a switch. A gate of the transistor 61 is electrically connected to a terminal M1. A gate of the transistor 62 is electrically connected to a terminal M2. A gate of the transistor 63 is electrically connected to a terminal M3. A gate of the transistor 64 is electrically connected to a terminal M4. The input terminal IN1 is electrically connected to the output terminal OUT through a source and a drain of the transistor 61. The input terminal IN2 is electrically connected to the output terminal OUT through a source and a drain of the transistor 62. The input terminal IN3 is electrically connected to the output terminal OUT through a source and a drain of the transistor 63. The input terminal IN4 is electrically connected to the output terminal OUT through a source and a drain of the transistor 64. In FIG. 4B, when 4-bit configuration data is input to the input terminals M1 to M4, any of signals input to the input terminals IN1 to IN4 can be selectively output from the output terminal OUT. Note that when two or more of the transistors 61 to 64 are turned on at the same time, two or more of the input terminals IN1 to IN4 can be electrically connected to each other.

Note that given elements each functioning as a switch can be used instead of the transistors 61 to 64.

Although FIG. 4B illustrates the example of the four-input and one-output selection circuit, this embodiment is not limited thereto. It is possible to use a selection circuit having five or more inputs and two or more outputs. The selection circuit may further include any of or all of a multiplexer, a diode, a resistor, an arithmetic circuit (an arithmetic element), and a switch. As the arithmetic circuit (the arithmetic element), a buffer, an inverter, a NAND circuit, a NOR circuit, a three-state buffer, a clocked inverter, or the like can be used. For example, an analog switch, a transistor, or the like can be used as the switch. Alternatively, an arithmetic circuit (an arithmetic element) to which either one or both a clock signal and an inversion signal of the clock signal are input can be used as the switch.

This embodiment can be combined with any of the other embodiments as appropriate.

(Embodiment 6)

A method for forming a programmable LSI is described. In this embodiment, a method for forming a programmable LSI is described giving the transistor 11 whose channel is formed in an oxide semiconductor layer, the capacitor 12, and a transistor 133 included in the arithmetic circuit 201 or the arithmetic circuit 202 that are included in the storage circuits in FIG. 1C, FIG. 1D, FIG. 2B, and FIG. 2C as examples. Here, the case where the transistor 133 is a transistor whose channel is formed in a silicon layer is given as an example.

Note that the transistor 101 in FIG. 5B, the transistor 101 in FIG. 5C, and the transistor 104 in FIG. 5D can be formed in a manner similar to that of the transistor 11. Further, the capacitor 103 in FIG. 5B and the capacitor 105 in FIG. 5D can be formed in a manner similar to that of the capacitor 12. The transistor 102 in FIG. 5B and the transistors 102 and 141 in FIG. 5C can be formed in a manner similar to that of the transistor 133.

Figure 13A:
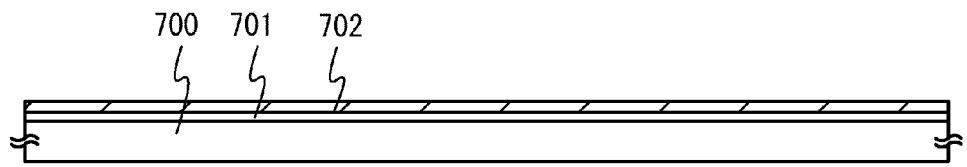
FIGS. 13A to 13D illustrate steps of forming a programmable LSI.

First, as illustrated in FIG. 13A, an insulating film 701 and a semiconductor film 702 that is separated from a single crystal semiconductor substrate are formed over a substrate 700.

Although there is no particular limitation on a material which can be used as the substrate 700, it is necessary that the material have at least heat resistance high enough to withstand heat treatment to be performed later. For example, a glass substrate formed by a fusion process or a float process, a quartz substrate, a semiconductor substrate, a ceramic substrate, or the like can be used as the substrate 700. In the case where the temperature of the heat treatment to be performed later is high, a glass substrate whose strain point is 730° C. or higher is preferably used as a glass substrate.

In this embodiment, a method for forming the transistor 133 is described below giving the semiconductor film 702 formed using single crystal silicon as an example. Note that a specific example of a method for forming the single crystal semiconductor film 702 is briefly described. First, an ion beam including ions which are accelerated by an electric field enters a bond substrate which is the single crystal semiconductor substrate and a fragile layer which is fragile because of local disorder of the crystal structure is formed in a region at a certain depth from a surface of the bond substrate. The depth at which the fragile layer is formed can be adjusted by the acceleration energy of the ion beam and the angle at which the ion beam enters. Then, the bond substrate and the substrate 700 which is provided with the insulating film 701 are attached to each other so that the insulating film 701 is sandwiched therebetween. After the bond substrate and the substrate 700 overlap with each other, a pressure of approximately 1 to 500 N/cm$^2$, preferably 11 to 20 N/cm$^2$ is applied to part of the bond substrate and part of the substrate 700 so that the substrates are attached to each other. When the pressure is applied to part of the bond substrate and part of the substrate 700, bonding between the bond substrate and the insulating film 701 starts from the parts, which results in bonding of the entire surface where the bond substrate and the insulating film 701 are in close contact with each other. After that, heat treatment is performed, so that microvoids that exist in the fragile layer are combined, and the volume of the microvoids is increased. Accordingly, a single crystal semiconductor film which is part of the bond substrate is separated from the bond substrate along the fragile layer. The temperature of the heat treatment is set so as not to exceed the strain point of the substrate 700. Then, the single crystal semiconductor film is processed into a desired shape by etching or the like, so that the semiconductor film 702 can be formed.

In order to control the threshold voltage, an impurity element imparting p-type conductivity, such as boron, aluminum, or gallium, or an impurity element imparting n-type conductivity, such as phosphorus or arsenic, may be added to the semiconductor film 702. An impurity element may be added to the semiconductor film which is not etched to have a predetermined shape or the semiconductor film 702 which is etched to have a predetermined shape in order to control the threshold voltage. Alternatively, an impurity element may be added to the bond substrate in order to control the threshold voltage. Alternatively, an impurity element may be added to the bond substrate in order to roughly control the threshold voltage, and an impurity element may also be added to the semiconductor film which is not etched to have a predetermined shape or the semiconductor film 702 which is etched to have a predetermined shape in order to finely control the threshold voltage.

Note that although the single crystal semiconductor film is used in this embodiment, this embodiment is not limited to this structure. For example, a bulk semiconductor substrate that is isolated by shallow trench isolation (STI) or the like may be used. A polycrystalline, microcrystalline, or amorphous semiconductor film which is formed over the insulating film 701 by vapor deposition may be used, for example. Alternatively, the semiconductor film may be crystallized by a known technique. As a known crystallization technique, laser crystallization using a laser beam or crystallization using a catalytic element can be used. Alternatively, crystallization using a catalytic element and laser crystallization can be used in combination. When a heat-resistant substrate such as a quartz substrate is used, any of thermal crystallization using an electrically heated oven, lamp heating crystallization using infrared light, crystallization using a catalytic element, and high-temperature heating at approximately 950° C. may be used in combination.

Figure 13B:
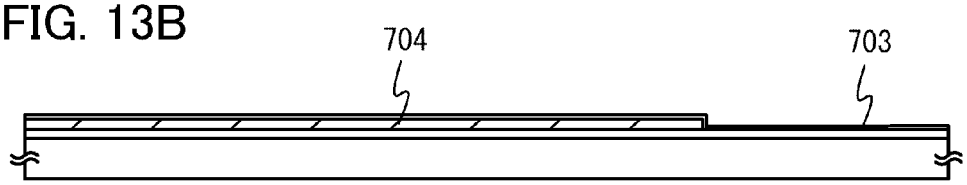

Next, as illustrated in FIG. 13B, a semiconductor layer 704 is formed using the semiconductor film 702. Then, a gate insulating film 703 is formed over the semiconductor layer 704.

The gate insulating film 703 can be formed using a single layer or a stack of layers of a film including silicon oxide, silicon nitride oxide, silicon oxynitride, silicon nitride, hafnium oxide, aluminum oxide, tantalum oxide, yttrium oxide, hafnium silicate ($HfSi_xO_y$ (x>0, y>0)), hafnium silicate to which nitrogen is added ($HfSi_xO_yN_z$ (x>0, y>0, z>0)), hafnium aluminate to which nitrogen is added ($HfAl_xO_yN_z$ (x>0, y>0, z>0)), or the like by plasma-enhanced CVD, sputtering, or the like, for example.

Note that in this specification, an oxynitride is a substance which includes more oxygen than nitrogen, and a nitride oxide is a substance which includes more nitrogen than oxygen.

The thickness of the gate insulating film 703 can be, for example, 1 to 100 nm, preferably 10 to 50 nm. In this embodiment, a single-layer insulating film containing silicon oxide is formed as the gate insulating film 703 by plasma-enhanced CVD.

Figure 13C:
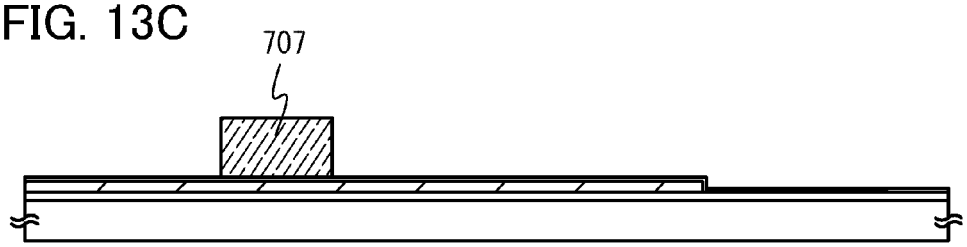

Then, as illustrated in FIG. 13C, a gate electrode 707 is formed.

A conductive film is formed and then is processed into a predetermined shape, so that the gate electrode 707 can be formed. The conductive film can be formed by CVD, sputtering, vapor deposition, spin coating, or the like. For the conductive film, tantalum (Ta), tungsten (W), titanium (Ti), molybdenum (Mo), aluminum (Al), copper (Cu), chromium (Cr), niobium (Nb), or the like can be used. An alloy containing the metal as its main component or a compound containing the metal may be used. Alternatively, the conductive film may be formed using a semiconductor such as polycrystalline silicon doped with an impurity element imparting conductivity, such as phosphorus, to the semiconductor film.

Note that although the gate electrode 707 is formed using a single-layer conductive film in this embodiment, this embodiment is not limited to this structure. The gate electrode 707 may be formed using a plurality of stacked conductive films.

As a combination of two conductive films, tantalum nitride or tantalum can be used for a first conductive film and tungsten can be used for a second conductive film. As well as the example, any of the following combinations can be used: tungsten nitride and tungsten; molybdenum nitride and molybdenum; aluminum and tantalum; aluminum and titanium; and the like. Since tungsten and tantalum nitride have high heat resistance, heat treatment for thermal activation can be performed in a step performed after the two conductive films are formed. Alternatively, as the combination of the two conductive films, for example, nickel silicide and silicon doped with an impurity element imparting n-type conductivity, tungsten silicide and silicon doped with an impurity element imparting n-type conductivity, or the like can be used.

In the case of a three-layer structure in which three conductive films are stacked, a layered structure of a molybdenum film, an aluminum film, and a molybdenum film is preferably used.

A light-transmitting oxide conductive film of indium oxide, indium oxide-tin oxide, indium oxide-zinc oxide, zinc oxide, zinc aluminum oxide, zinc aluminum oxynitride, zinc gallium oxide, or the like can be used as the gate electrode 707.

Alternatively, the gate electrode 707 may be selectively formed by a droplet discharge method without the use of a mask. A droplet discharge method is a method for forming a predetermined pattern by discharge or ejection of a droplet containing a predetermined composition from an orifice, and includes an inkjet method in its category.

In addition, the gate electrode 707 can be formed in such a manner that a conductive film is formed and then is etched by inductively coupled plasma (ICP) etching under appropriately controlled conditions (e.g., the amount of electric power applied to a coiled electrode layer, the amount of electric power applied to an electrode layer on the substrate side, and the electrode temperature on the substrate side) to have a desired tapered shape. Further, an angle and the like of the tapered shape may be controlled by the shape of a mask. Note that for an etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

Figure 13D:
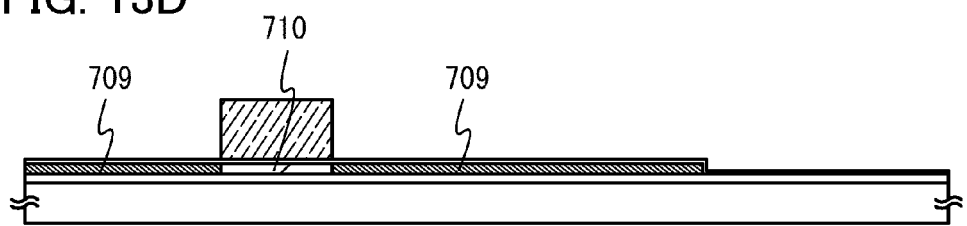

Next, as illustrated in FIG. 13D, when an impurity element imparting one conductivity is added to the semiconductor layer 704 with the gate electrode 707 used as a mask, a channel formation region 710 overlapping with the gate electrode 707 and a pair of impurity regions 709 sandwiching the channel formation region 710 are formed in the semiconductor layer 704.

In this embodiment, an impurity element imparting p-type conductivity (e.g., boron) is added to the semiconductor layer 704.

Figure 14A:
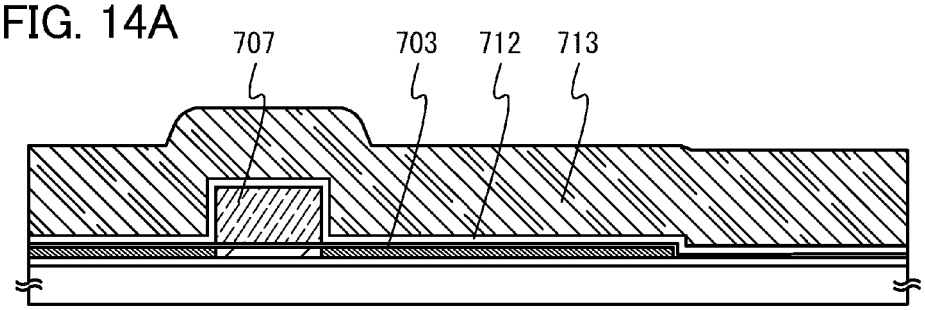
FIGS. 14A to 14C illustrate steps of forming a programmable LSI.

Next, as illustrated in FIG. 14A, insulating films 712 and 713 are formed to cover the gate insulating film 703 and the gate electrode 707. Specifically, inorganic insulating films of silicon oxide, silicon nitride, silicon nitride oxide, silicon oxynitride, aluminum nitride, aluminum nitride oxide, or the like can be used as the insulating films 712 and 713. In particular, the insulating films 712 and 713 are preferably formed using low dielectric constant (low-k) materials because capacitance due to overlapping of electrodes or wirings can be substantially reduced. Note that a porous insulating film including such a material may be used as the insulating films 712 and 713. Since the porous insulating film has lower dielectric constant than a dense insulating layer, parasitic capacitance due to overlapping of electrodes or wirings can be further reduced.

In this embodiment, silicon oxynitride is used for the insulating film 712, and silicon nitride oxide is used for the insulating film 713. In addition, although the insulating films 712 and 713 are formed over the gate electrode 707 in this embodiment, in the present invention, only one insulating film may be formed over the gate electrode 707, or a plurality of insulating films of three or more layers may be stacked over the gate electrode 707.

Figure 14B:
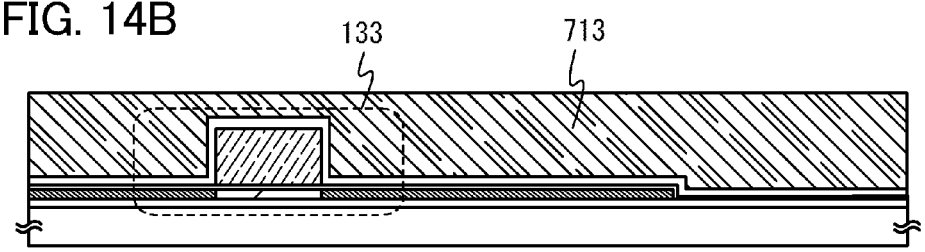

Next, as illustrated in FIG. 14B, the insulating film 713 is subjected to chemical mechanical polishing (CMP) or etching, so that a top surface of the insulating film 713 is flattened. Note that in order to improve the characteristics of the transistor 11 which is formed later, a surface of the insulating film 713 is preferably flattened as much as possible.

Through the above steps, the transistor 133 can be formed.

Figure 14C:
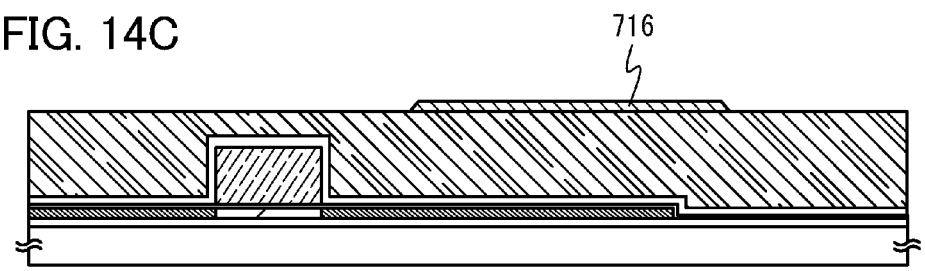

Next, a method for forming the transistor 11 is described. First, as illustrated in FIG. 14C, an oxide semiconductor layer 716 is formed over the insulating film 713.

The oxide semiconductor layer 716 can be formed by processing an oxide semiconductor film formed over the insulating film 713 into a desired shape. The thickness of the oxide semiconductor film is 2 to 200 nm, preferably 3 to 50 nm, more preferably 3 to 20 nm. The oxide semiconductor film is deposited by sputtering using an oxide semiconductor as a target. Alternatively, the oxide semiconductor film can be formed by sputtering in a rare gas (e.g., argon) atmosphere, an oxygen atmosphere, or a mixed atmosphere of a rare gas (e.g., argon) and oxygen.

Note that before the oxide semiconductor film is deposited by sputtering, dust on the surface of the insulating film 713 is preferably removed by reverse sputtering in which an argon gas is introduced and plasma is generated. The reverse sputtering is a method in which, without application of voltage to a target side, an RF power source is used for application of voltage to a substrate side in an argon atmosphere and plasma is generated in the vicinity of the substrate so that a substrate surface is modified. Note that nitrogen, helium, or the like may be used instead of the argon atmosphere. Alternatively, an argon atmosphere to which oxygen, nitrous oxide, or the like is added may be used. Alternatively, an argon atmosphere to which chlorine, carbon tetrafluoride, or the like is added may be used.

The oxide semiconductor layer includes at least one or more elements selected from In, Ga, Sn, and Zn. For example, a quaternary metal oxide such as an In—Sn—Ga—Zn—O-based oxide semiconductor; a ternary metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor layer, or a Sn—Al—Zn—O-based oxide semiconductor; a binary metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based material; or a unary metal oxide such as an In—O-based oxide semiconductor, a Sn—O-based oxide semiconductor, or a Zn—O-based oxide semiconductor can be used. Any of the above oxide semiconductors may contain an element other than In, Ga, Sn, and Zn, for example, $SiO_2$.

For example, an In—Ga—Zn—O-based oxide semiconductor means an oxide semiconductor containing indium (In), gallium (Ga), and zinc (Zn), and there is no limitation on the composition ratio.

For the oxide semiconductor layer, a thin film represented by a chemical formula, $InMO_3(ZnO)_m$ (m>0), can be used. Here, M denotes one or more metal elements selected from Zn, Ga, Al, Mn, or Co. For example, M can be Ga, Ga and Al, Ga and Mn, Ga and Co, or the like.

In the case where an In—Zn—O-based material is used for the oxide semiconductor, a target used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), more preferably In:Zn=1.5:1 to 15:1 in an atomic ratio ($In_2O_3$:ZnO=3:4 to 15:2 in a molar ratio). For example, when a target used for deposition of an In—Zn—O-based oxide semiconductor has a composition ratio of In:Zn:O=X: Y:Z in an atomic ratio, Z>1.5X+Y.

In this embodiment, a 30-nm-thick In—Ga—Zn—O-based oxide semiconductor thin film which is obtained by sputtering using a target including indium (In), gallium (Ga), and zinc (Zn) is used as the oxide semiconductor film. A target with a composition ratio of metals, In:Ga:Zn=1:1:0.5, In:Ga:Zn=1:1:1, or In:Ga:Zn=1:1:2 can be used as the target, for example. The filling factor of the target including In, Ga, and Zn is higher than or equal to 90% and lower than or equal to 100%, preferably higher than or equal to 95% and lower than 100%. With the use of a target with a high filling factor, a dense oxide semiconductor film is formed.

In this embodiment, the oxide semiconductor film is deposited in such a manner that the substrate is held in a treatment chamber kept at reduced pressure, moisture remaining in the treatment chamber is removed, a sputtering gas from which hydrogen and moisture are removed is introduced, and the target is used. The substrate temperature may be 100 to 600° C., preferably 200 to 400° C. during deposition. By deposition of the oxide semiconductor film while the substrate is heated, the concentration of impurities included in the deposited oxide semiconductor film can be lowered. In addition, damage by sputtering can be reduced. In order to remove moisture remaining in the treatment chamber, an adsorption vacuum pump is preferably used. For example, a cryopump, an ion pump, or a titanium sublimation pump is preferably used. A turbo pump to which a cold trap is added may be used as an exhaustion means. For example, a hydrogen atom, a compound containing a hydrogen atom, such as water (preferably a compound containing a carbon atom), and the like are exhausted from the treatment chamber with the use of a cryopump. Thus, the concentration of impurities contained in the oxide semiconductor film deposited in the treatment chamber can be lowered.

As an example of the deposition condition, the following condition is employed: the distance between the substrate and the target is 100 mm, the pressure is 0.6 Pa, the direct current (DC) power is 0.5 kW, and the atmosphere is an oxygen atmosphere (the proportion of the oxygen flow rate is 100%). Note that it is preferable that pulsed direct-current (DC) power be used because dust generated during deposition can be reduced and the film thickness can be uniform.

Further, when the leakage rate of the treatment chamber of the sputtering apparatus is set to $1\times10^{-10}$ Pa×m$^3$/s or lower, mixing of impurities such as alkali metal or hydride into the oxide semiconductor film that is being deposited by sputtering can be reduced. Furthermore, with the use of the adsorption vacuum pump as an evacuation system, counter flow of impurities such as alkali metal, a hydrogen atom, a hydrogen molecule, water, a hydroxyl group, or hydride from the evacuation system can be reduced.

When the purity of the target is set to 99.99% or higher, alkali metal, a hydrogen atom, a hydrogen molecule, water, a hydroxyl group, hydride, or the like mixed into the oxide semiconductor film can be reduced. In addition, with the use of the target, the concentration of an alkali metal such as lithium, sodium, or potassium can be reduced in the oxide semiconductor film.

Note that in order that hydrogen, a hydroxyl group, and moisture be contained in the oxide semiconductor film as little as possible, it is preferable that an impurity such as hydrogen or moisture that is adsorbed on the substrate 700 be eliminated and exhausted by preheating of the substrate 700 over which the insulating films 712 and 713 are formed in a preheating chamber of a sputtering apparatus, as pretreatment for deposition. The temperature of the preheating is 100 to 400° C., preferably 150 to 300° C. As an exhaustion means provided in the preheating chamber, a cryopump is preferable. Note that the preheating treatment can be omitted. This preheating may be similarly performed on the substrate 700 over which conductive layers 719 and 720 are formed before the deposition of a gate insulating film 721.

Note that etching for forming the oxide semiconductor layer 716 may be dry etching, wet etching, or both dry etching and wet etching. As an etching gas used for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching, parallel plate reactive ion etching (RIE) or inductively coupled plasma (ICP) etching can be used. In order to etch the film to have a desired shape, the etching conditions (e.g., the amount of electric power applied to a coiled electrode, the amount of electric power applied to an electrode on the substrate side, and the electrode temperature on the substrate side) are adjusted as appropriate.

As an etchant used for the wet etching, a mixed solution of phosphoric acid, acetic acid, and nitric acid, or organic acid such as citric acid or oxalic acid can be used. In this embodiment, ITO-07N (produced by KANTO CHEMICAL CO., INC.) is used.

A resist mask for forming the oxide semiconductor layer 716 may be formed by an inkjet method. When the resist mask is formed by an inkjet method, a photomask is not used; thus, manufacturing cost can be reduced.

Note that it is preferable that reverse sputtering be performed before the formation of a conductive film in a subsequent step so that resist residues and the like that attach onto surfaces of the oxide semiconductor layer 716 and the insulating film 713 are removed.

Note that the oxide semiconductor film deposited by sputtering or the like contains moisture or hydrogen (including a hydroxyl group) as an impurity in some cases. Moisture or hydrogen easily forms a donor level and thus serve as an impurity in the oxide semiconductor. Thus, in one embodiment of the present invention, in order to reduce impurities such as moisture or hydrogen in the oxide semiconductor film (in order to perform dehydration or dehydrogenation), the oxide semiconductor layer 716 is subjected to heat treatment in a reduced-pressure atmosphere, an inert gas atmosphere of nitrogen, a rare gas, or the like, an oxygen gas atmosphere, or ultra dry air (the moisture amount is 20 ppm (−55° C. by conversion into a dew point) or less, preferably 1 ppm or less, more preferably 10 ppb or less, in the case where measurement is performed by a dew point meter in a cavity ring down laser spectroscopy (CRDS) method).

By performing heat treatment on the oxide semiconductor layer 716, moisture or hydrogen in the oxide semiconductor layer 716 can be eliminated. Specifically, heat treatment may be performed at a temperature higher than or equal to 250° C. and lower than or equal to 750° C., preferably higher than or equal to 400° C. and lower than the strain point of the substrate. For example, heat treatment may be performed at 500° C. for approximately 3 to 6 minutes. When RTA is used for the heat treatment, dehydration or dehydrogenation can be performed in a short time; thus, treatment can be performed even at a temperature higher than the strain point of a glass substrate.

In this embodiment, an electric furnace that is one of heat treatment apparatuses is used.

Note that the heat treatment apparatus is not limited to an electric furnace, and may be provided with a device for heating an object by thermal conduction or thermal radiation from a heater such as a resistance heater. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus with which heat treatment is performed using a high-temperature gas. An inert gas which does not react with an object by heat treatment, such as nitrogen or a rare gas (e.g., argon), is used as the gas.

In the heat treatment, it is preferable that moisture, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably 6N (99.9999%) or higher, more preferably 7N (99.99999%) or higher (that is, the impurity concentration is 1 ppm or lower, preferably 0.1 ppm or lower).

Note that it has been pointed out that an oxide semiconductor is insensitive to impurities, there is no problem when a considerable amount of metal impurities is contained in the film, and soda-lime glass which contains a large amount of alkali metal such as sodium and is inexpensive can be used (Kamiya, Nomura, and Hosono, "Carrier Transport Properties and Electronic Structures of Amorphous Oxide Semiconductors: The present status", KOTAI BUTSURI (SOLID STATE PHYSICS), 2009, Vol. 44, pp. 621-633). But such consideration is not appropriate. Alkali metal is not an element included in an oxide semiconductor and thus is an impurity. Alkaline earth metal is also an impurity in the case where alkaline earth metal is not included in an oxide semiconductor. Alkali metal, in particular, Na becomes $Na^+$ when an insulating film which is in contact with an oxide semiconductor layer is an oxide and Na diffuses into the insulating film. In addition, in the oxide semiconductor layer, Na cuts or enters a bond between metal and oxygen which are included in an oxide semiconductor. As a result, for example, degradation in transistor characteristics, such as a normally on state of the transistor due to a shift in the threshold voltage in a negative direction, or a decrease in mobility, occurs. A variation in characteristics also occurs. Such degradation in transistor characteristics and variation in characteristics due to the impurity are outstanding when the concentration of hydrogen in the oxide semiconductor layer is sufficiently low. Thus, when the concentration of hydrogen in the oxide semiconductor layer is $1\times10^{18}/cm^3$ or lower, preferably $1\times10^{17}/cm^3$ or lower, the concentration of the impurity is preferably lowered. Specifically, the measurement value of a Na concentration by secondary ion mass spectrometry is preferably $5\times10^{16}/cm^3$ or less, more preferably $1\times10^{16}/cm^3$ or less, still more preferably $1\times10^{15}/cm^3$ or less. Similarly, the measurement value of a Li concentration is preferably $5\times10^{15}/cm^3$ or less, more preferably $1\times10^{15}/cm^3$ or less. Similarly, the measurement value of a K concentration is preferably $5\times10^{15}/cm^3$ or less, more preferably $1\times10^{15}/cm^3$ or less.

Through the above steps, the concentration of hydrogen in the oxide semiconductor layer 716 can be lowered and the oxide semiconductor layer 716 can be highly purified. Accordingly, the oxide semiconductor layer can be stabilized. In addition, the heat treatment at a temperature of lower than or equal to the glass transition temperature makes it possible to form an oxide semiconductor layer with extremely low carrier density and a wide band gap. Thus, the transistor can be formed using a large substrate, so that mass productivity can be improved. Further, with the use of the highly purified oxide semiconductor layer in which the hydrogen concentration is lowered, it is possible to form a transistor with high withstand voltage and extremely low off-state current. The heat treatment can be performed at any time after the oxide semiconductor layer is deposited.

An oxide semiconductor film can be single crystal, polycrystalline (also referred to as polycrystal), or amorphous, for example.

The oxide semiconductor film is preferably a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits into a cube whose one side is less than 100 nm. From an observation image obtained with a transmission electron microscope (TEM), a boundary between the amorphous part and a crystal part in the CAAC-oxide semiconductor film is not clear. Further, with the TEM, a grain boundary in the CAAC-oxide semiconductor film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic order which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85 to 95°. In addition, a simple term "parallel" includes a range from −5 to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the CAAC-OS film is higher than that in the vicinity of the surface where the CAAC-OS film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to the normal vector of the surface where the CAAC-OS film is formed or the normal vector of the surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to the normal vector of the surface where the CAAC-OS film is formed or the normal vector of the surface of the CAAC-OS film. The crystal part is formed by deposition or by performing treatment for crystallization such as heat treatment after deposition.

With the use of the CAAC-OS film in a transistor, a change in electrical characteristics of the transistor due to irradiation with visible light or ultraviolet light can be reduced. Thus, the transistor has high reliability.

Figure 15A:
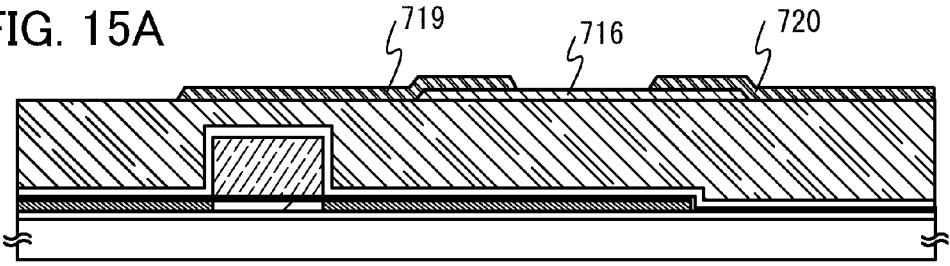
FIGS. 15A to 15D illustrate steps of forming a programmable LSI.

Next, as illustrated in FIG. 15A, the conductive layers 719 and 720 which are in contact with the oxide semiconductor layer 716 are formed. The conductive layers 719 and 720 function as a source and drain electrodes.

Specifically, the conductive layers 719 and 720 can be formed in such a manner that a conductive film is formed by sputtering or vacuum vapor deposition and then is processed into a predetermined shape.

As the conductive film which serves as the conductive layers 719 and 720, any of the following materials can be used: an element selected from aluminum, chromium, copper, tantalum, titanium, molybdenum, or tungsten; an alloy including any of these elements; an alloy film including the above elements in combination; and the like. Alternatively, a structure may be employed in which a film of a refractory metal such as chromium, tantalum, titanium, molybdenum, or tungsten is stacked over or below a metal film of aluminum, copper, or the like. Aluminum or copper is preferably used in combination with a refractory metal material in order to avoid problems with heat resistance and corrosion. As the refractory metal material, molybdenum, titanium, chromium, tantalum, tungsten, neodymium, scandium, yttrium, or the like can be used.

Further, the conductive film which serves as the conductive layers 719 and 720 may have a single-layer structure or a layered structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in that order, and the like can be given. A Cu—Mg—Al alloy, a Mo—Ti alloy, Ti, and Mo have high adhesion with an oxide film. Thus, when the conductive layers 719 and 720 are formed using a stack in which a conductive film including a Cu—Mg—Al alloy, a Mo—Ti alloy, Ti, or Mo is used for a lower layer and a conductive film including Cu is used for an upper layer, the adhesion between an insulating film which is an oxide film and the conductive layers 719 and 720 can be increased.

For the conductive film which serves as the conductive layers 719 and 720, a conductive metal oxide may be used. As the conductive metal oxide, indium oxide, tin oxide, zinc oxide, indium oxide-tin oxide, indium oxide-zinc oxide, or the conductive metal oxide material containing silicon or silicon oxide can be used.

In the case where heat treatment is performed after the formation of the conductive film, the conductive film preferably has heat resistance high enough to withstand the heat treatment.

Note that each material and etching conditions are adjusted as appropriate so that the oxide semiconductor layer 716 is not removed as much as possible during etching of the conductive film. Depending on the etching conditions, an exposed portion of the oxide semiconductor layer 716 is partly etched, so that a groove (a depression portion) is formed in some cases.

In this embodiment, a titanium film is used as the conductive film. Thus, the conductive film can be selectively etched by wet etching using a solution (an ammonia hydrogen peroxide mixture) containing ammonia and hydrogen peroxide water. Specifically, an ammonia hydrogen peroxide mixture in which oxygenated water of 31 wt %, ammonia water of 28 wt %, and water are mixed at a volume ratio of 5:2:2 is used. Alternatively, dry etching may be performed on the conductive film with the use of a gas containing chlorine ($Cl_2$), boron chloride ($BCl_3$), or the like.

Note that in order to reduce the number of photomasks used in a photolithography process and to reduce the number of processes, etching may be performed using a multi-tone mask through which light is transmitted to have a plurality of intensities. A resist mask formed using a multi-tone mask has a plurality of thicknesses and can be changed in shape by etching; thus, the resist mask can be used in a plurality of etching processes for processing films into different patterns. Accordingly, a resist mask corresponding to at least two or more kinds of different patterns can be formed by one multi-tone mask. Thus, the number of exposure masks and the number of corresponding photolithography processes can be reduced, so that the process can be simplified.

Further, an oxide conductive film functioning as a source and drain regions may be provided between the oxide semiconductor layer 716 and the conductive layers 719 and 720 functioning as a source and drain electrodes. The material of the oxide conductive film preferably contains zinc oxide as a component and preferably does not contain indium oxide. For such an oxide conductive film, zinc oxide, zinc aluminum oxide, zinc aluminum oxynitride, gallium zinc oxide, or the like can be used.

For example, in the case where the oxide conductive film is formed, etching for forming the oxide conductive film and etching for forming the conductive layers 719 and 720 may be performed simultaneously.

With provision of the oxide conductive film functioning as a source and drain regions, resistance between the oxide semiconductor layer 716 and the conductive layers 719 and 720 can be lowered, so that the transistor can operate at high speed. In addition, with provision of the oxide conductive film functioning as a source and drain regions, the withstand voltage of the transistor can be increased.

Next, plasma treatment may be performed using a gas such as $N_2O$, $N_2$, or Ar. With this plasma treatment, water and the like which attach to a surface of the oxide semiconductor layer exposed are removed. Alternatively, plasma treatment may be performed using a mixture gas of oxygen and argon.

Figure 15B:
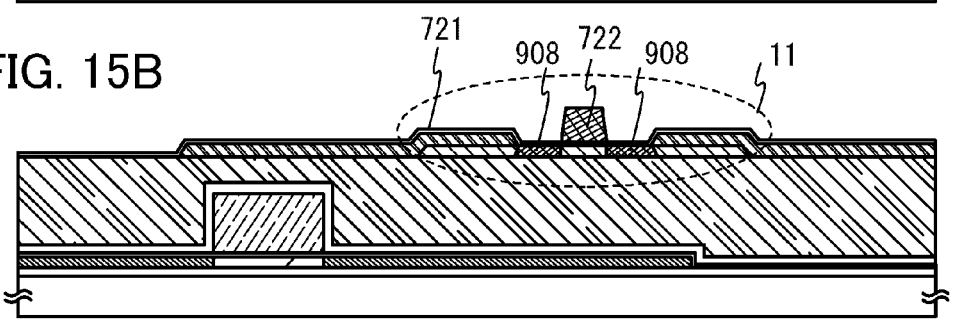

After the plasma treatment, as illustrated in FIG. 15B, the gate insulating film 721 is formed to cover the conductive layers 719 and 720 and the oxide semiconductor layer 716. Then, a gate electrode 722 is formed over the gate insulating film 721 to overlap with the oxide semiconductor layer 716.

Then, a pair of high-concentration regions 908 is formed by addition of a dopant imparting n-type conductivity to the oxide semiconductor layer 716 with the use of the gate electrode 722 as a mask after the formation of the gate electrode 722. Note that in the oxide semiconductor layer 716, a region which overlaps with the gate electrode 722 with the gate insulating film 721 provided therebetween is a channel formation region. The oxide semiconductor layer 716 includes the channel formation region between the pair of high-concentration regions 908. The dopant used for forming the high-concentration regions 908 can be added by ion implantation. A rare gas such as helium, argon, or xenon; a Group 15 atom such as nitrogen, phosphorus, arsenic, or antimony; or the like can be used as the dopant, for example. For example, in the case where nitrogen is used as the dopant, the concentration of nitrogen atoms in the high-concentration region 908 is preferably $5\times10^{19}/cm^3$ or higher and $1\times10^{22}/cm^3$ or lower. The high-concentration region 908 to which the dopant imparting n-type conductivity is added has higher conductivity than other regions in the oxide semiconductor layer 716. Thus, with provision of the high-concentration regions 908 in the oxide semiconductor layer 716, resistance between the source and drain electrodes (the conductive layers 719 and 720) can be lowered.

When the resistance between the source and drain electrodes (the conductive layers 719 and 720) is lowered, high on-state current and high-speed operation can be secured even when the transistor 11 is miniaturized. In addition, by miniaturization of the transistor 11, storage capacity per unit area of the configuration memory 311 can be increased.

In the case where an In—Ga—Zn—O-based oxide semiconductor is used for the oxide semiconductor layer 716, an oxide semiconductor in the high-concentration region 908 has a wurtzite crystal structure by heat treatment at 300 to 600° C. for 1 hour after the addition of nitrogen. When the oxide semiconductor in the high-concentration region 908 has a wurtzite crystal structure, the conductivity of the high-concentration region 908 can be further increased and the resistance between the source and drain electrodes (the conductive layers 719 and 720) can be further lowered. Note that in order to effectively lower the resistance between the source and drain electrodes (the conductive layers 719 and 720) by formation of an oxide semiconductor with a wurtzite crystal structure, the concentration of nitrogen atoms in the high-concentration region 908 is preferably $1\times10^{20}/cm^3$ or higher and 7 at. % or lower in the case where nitrogen is used as the dopant. Even in the case where the concentration of nitrogen atoms is lower than the above range, an oxide semiconductor with a wurtzite crystal structure can be obtained in some cases.

The gate insulating film 721 can be formed using a material and a layered structure which are similar to those of the gate insulating film 703. Note that the gate insulating film 721 preferably includes impurities such as moisture or hydrogen as little as possible, and the gate insulating film 721 may be formed using a single-layer insulating film or a plurality of insulating films stacked. When hydrogen is contained in the gate insulating film 721, hydrogen enters the oxide semiconductor layer 716 or oxygen in the oxide semiconductor layer 716 is extracted by hydrogen, whereby the oxide semiconductor layer 716 has lower resistance (n-type conductivity) and a parasitic channel might be formed. Thus, it is important that a deposition method in which hydrogen is not used be employed in order to form the gate insulating film 721 containing hydrogen as little as possible. A material having a high barrier property is preferably used for the gate insulating film 721. As the insulating film having a high barrier property, a silicon nitride film, a silicon nitride oxide film, an aluminum nitride film, an aluminum nitride oxide film, or the like can be used, for example. When a plurality of insulating films stacked are used, an insulating film having low proportion of nitrogen, such as a silicon oxide film or a silicon oxynitride film, is formed on a side which is closer to the oxide semiconductor layer 716 than the insulating film having a high barrier property. Then, the insulating film having a high barrier property is formed to overlap with the conductive layers 719 and 720 and the oxide semiconductor layer 716 with the insulating film having low proportion of nitrogen sandwiched therebetween. When the insulating film having a high barrier property is used, impurities such as moisture or hydrogen can be prevented from entering the oxide semiconductor layer 716, the gate insulating film 721, or the interface between the oxide semiconductor layer 716 and another insulating film and the vicinity thereof. In addition, the insulating film having low proportion of nitrogen, such as a silicon oxide film or a silicon oxynitride film, is formed to be in contact with the oxide semiconductor layer 716, so that the insulating film having a high barrier property can be prevented from being in direct contact with the oxide semiconductor layer 716.

In this embodiment, the gate insulating film 721 with a structure in which a 100-nm-thick silicon nitride film formed by sputtering is stacked over a 200-nm-thick silicon oxide film formed by sputtering is formed. The substrate temperature during deposition is in the range of room temperature to 300° C., and is 100° C. in this embodiment.

After the gate insulating film 721 is formed, heat treatment may be performed. The heat treatment is performed in a nitrogen atmosphere, ultra-dry air, or a rare gas (e.g., argon or helium) atmosphere preferably at 200 to 400° C., for example, 250 to 350° C. It is preferable that the content of water in the gas be 20 ppm or lower, preferably 1 ppm or lower, more preferably 10 ppb or lower. In this embodiment, for example, heat treatment is performed at 250° C. for 1 hour in a nitrogen atmosphere. Alternatively, RTA treatment may be performed at a high temperature for a short time before the formation of the conductive layers 719 and 720 in a manner similar to that of the heat treatment performed on the oxide semiconductor layer for reduction of moisture or hydrogen. Even when oxygen defects are generated in the oxide semiconductor layer 716 by the heat treatment performed on the oxide semiconductor layer 716, oxygen is supplied to the oxide semiconductor layer 716 from the gate insulating film 721 by performing heat treatment after provision of the gate insulating film 721 containing oxygen. By the supply of oxygen to the oxide semiconductor layer 716, oxygen defects that serve as donors can be reduced in the oxide semiconductor layer 716 and the stoichiometric proportion can be satisfied. It is preferable that the proportion of oxygen in the oxide semiconductor layer 716 be higher than the stoichiometric proportion. As a result, the oxide semiconductor layer 716 can be made substantially intrinsic and variation in electrical characteristics of the transistor due to oxygen defects can be reduced; thus, the electrical characteristics can be improved. The timing of this heat treatment is not particularly limited as long as it is after the formation of the gate insulating film 721. When this heat treatment serves as heat treatment in another step (e.g., heat treatment during formation of a resin film or heat treatment for lowering the resistance of a transparent conductive film), the oxide semiconductor layer 716 can be made substantially intrinsic without an increase in the number of steps.

Alternatively, the oxygen defects that serve as donors in the oxide semiconductor layer 716 may be reduced by performing heat treatment on the oxide semiconductor layer 716 in an oxygen atmosphere so that oxygen is added to the oxide semiconductor. The heat treatment is performed at, for example, higher than or equal to 100° C. and lower than 350° C., preferably higher than or equal to 150° C. and lower than 250° C. It is preferable that an oxygen gas used for the heat treatment in an oxygen atmosphere do not include water, hydrogen, or the like. Alternatively, the purity of the oxygen gas which is introduced into the heat treatment apparatus is preferably 6N (99.9999%) or higher, more preferably 7N (99.99999%) or higher (that is, the impurity concentration in oxygen is 1 ppm or lower, preferably 0.1 ppm or lower).

Alternatively, oxygen may be added to the oxide semiconductor layer 716 by ion implantation, ion doping, or the like so that oxygen defects that serve as donors are reduced. For example, oxygen made to be plasma with a microwave of 2.45 GHz may be added to the oxide semiconductor layer 716.

The gate electrode 722 can be formed in such a manner that a conductive film is formed over the gate insulating film 721 and then is etched. The gate electrode 722 can be formed using a material which is similar to that of the gate electrode 707 or the conductive layers 719 and 720.

The thickness of the gate electrode 722 is 10 to 400 nm, preferably 100 to 200 nm. In this embodiment, after a 150-nm-thick conductive film for the gate electrode is formed by sputtering using a tungsten target, the conductive film is processed into a desired shape by etching, so that the gate electrode 722 is formed. A resist mask may be formed by an inkjet method. When the resist mask is formed by an inkjet method, a photomask is not used; thus, manufacturing cost can be reduced.

Through the above steps, the transistor 11 is formed.

In the transistor 11, the source and drain electrodes (the conductive layers 719 and 720) do not overlap with the gate electrode 722. In other words, a gap which is larger than the thickness of the gate insulating film 721 is provided between the source and drain electrodes (the conductive layers 719 and 720) and the gate electrode 722. Thus, in the transistor 11, parasitic capacitance formed between the source and drain electrodes and the gate electrode can be reduced. Consequently, high-speed operation can be performed.

Note that the transistor 11 is not limited to a transistor whose channel is formed in an oxide semiconductor layer, and it is possible to use a transistor that includes a semiconductor material whose band gap is wider than that of silicon and whose intrinsic carrier density is lower than that of silicon in a channel formation region. As such a semiconductor material, for example, silicon carbide, gallium nitride, or the like can be used instead of an oxide semiconductor. With a channel formation region including such a semiconductor material, a transistor whose off-state current is extremely low can be obtained.

Although the transistor 11 is a single-gate transistor, a multi-gate transistor including a plurality of channel formation regions can be formed when a plurality of gate electrodes electrically connected to each other are included when needed.

Note that an insulating film which is in contact with the oxide semiconductor layer 716 (in this embodiment, corresponding to the gate insulating film 721) may be formed using an insulating material containing a Group 13 element and oxygen. Many oxide semiconductor materials contain an element that belongs to Group 13, and an insulating material containing a Group 13 element works well with an oxide semiconductor. By using such an insulating material containing a Group 13 element for the insulating film which is in contact with the oxide semiconductor layer, the state of an interface with the oxide semiconductor layer can be kept well.

An insulating material containing a Group 13 element is an insulating material containing one or more Group 13 elements. Examples of the insulating material containing a Group 13 element include gallium oxide, aluminum oxide, aluminum gallium oxide, and gallium aluminum oxide. Here, aluminum gallium oxide is a material whose content of aluminum is larger than the content of gallium in an atomic percent, and gallium aluminum oxide is a material whose content of gallium is larger than or equal to the content of aluminum in an atomic percent.

For example, in the case where an insulating film is formed in contact with an oxide semiconductor layer containing gallium, when a material containing gallium oxide is used for the insulating film, favorable characteristics can be kept at the interface between the oxide semiconductor layer and the insulating film. For example, when the oxide semiconductor layer and the insulating film containing gallium oxide are provided in contact with each other, pile up of hydrogen at the interface between the oxide semiconductor layer and the insulating film can be reduced. Note that a similar effect can be obtained in the case where an element that belongs to the same group as a constituent element of the oxide semiconductor is used for the insulating film. For example, it is effective to form an insulating film with the use of a material containing aluminum oxide. Aluminum oxide does not easily transmit water. Thus, it is preferable to use the material including aluminum oxide in order to prevent water from entering the oxide semiconductor layer.

The insulating film which is in contact with the oxide semiconductor layer 716 preferably contains oxygen in a proportion higher than the stoichiometric proportion by heat treatment in an oxygen atmosphere or oxygen doping. Oxygen doping is addition of oxygen to a bulk. Note that the term "bulk" is used in order to clarify that oxygen is added not only to a surface of a thin film but also to the inside of the thin film. The term "oxygen doping" also means "oxygen plasma doping" in which oxygen which is made to be plasma is added to a bulk. The oxygen doping may be performed by ion implantation or ion doping.

For example, in the case where the insulating film which is in contact with the oxide semiconductor layer 716 is formed using gallium oxide, the composition of gallium oxide can be $Ga_2O_X$ ($X=3+\alpha$, $0<\alpha<1$) by heat treatment in an oxygen atmosphere or oxygen doping.

In the case where the insulating film which is in contact with the oxide semiconductor layer 716 is formed using aluminum oxide, the composition of aluminum oxide can be $Al_2O_X$ ($X=3+\alpha$, $0<\alpha<1$) by heat treatment in an oxygen atmosphere or oxygen doping.

In the case where the insulating film which is in contact with the oxide semiconductor layer 716 is formed using gallium aluminum oxide (aluminum gallium oxide), the composition of gallium aluminum oxide (aluminum gallium oxide) can be $Ga_XAl_{2-X}O_{3+\alpha}$ ($0<X<2$, $0<\alpha<1$) by heat treatment in an oxygen atmosphere or oxygen doping.

By oxygen doping, an insulating film including a region where the proportion of oxygen is higher than the stoichiometric proportion can be formed. When the insulating film including such a region is in contact with the oxide semiconductor layer, oxygen that exists excessively in the insulating film is supplied to the oxide semiconductor layer, and oxygen deficiency in the oxide semiconductor layer or at the interface between the oxide semiconductor layer and the insulating film is reduced. Thus, the oxide semiconductor layer can be an intrinsic or substantially intrinsic oxide semiconductor.

The insulating film including a region where the proportion of oxygen is higher than the stoichiometric proportion may be applied to either the insulating film placed on an upper side of the oxide semiconductor layer or the insulating film placed on a lower side of the oxide semiconductor layer of the insulating films which are in contact with the oxide semiconductor layer 716; however, it is preferable to apply such an insulating film to both the insulating films. The above effect can be enhanced with a structure where the oxide semiconductor layer 716 is sandwiched between the insulating films each including a region where the proportion of oxygen is higher than the stoichiometric proportion, which are used as the insulating films in contact with the oxide semiconductor layer 716 and positioned on the upper side and the lower side of the oxide semiconductor layer 716.

The insulating films on the upper side and the lower side of the oxide semiconductor layer 716 may contain the same constituent element or different constituent elements. For example, the insulating films on the upper side and the lower side may be both formed using gallium oxide whose composition is $Ga_2O_X$ ($X=3+\alpha$, $0<\alpha<1$). Alternatively, one of the insulating films on the upper side and the lower side may be formed using $Ga_2O_X$ ($X=3+\alpha$, $0<\alpha<1$) and the other may be formed using aluminum oxide whose composition is $Al_2O_X$ ($X=3+\alpha$, $0<\alpha<1$).

The insulating film which is in contact with the oxide semiconductor layer 716 may be formed by a stack of insulating films each including a region where the proportion of oxygen is higher than the stoichiometric proportion. For example, the insulating film on the upper side of the oxide semiconductor layer 716 may be formed as follows: gallium oxide whose composition is $Ga_2O_X$ ($X=3+\alpha$, $0<\alpha<1$) is formed and gallium aluminum oxide (aluminum gallium oxide) whose composition is $Ga_XAl_{2-X}O_{3-\alpha}$ ($0<X<2$, $0<\alpha<1$) may be formed thereover. Note that the insulating film on the lower side of the oxide semiconductor layer 716 may be formed by a stack of insulating films each including a region where the proportion of oxygen is higher than the stoichiometric proportion. Alternatively, both the insulating films on the upper side and the lower side of the oxide semiconductor layer 716 may be formed by a stack of insulating films each including a region where the proportion of oxygen is higher than the stoichiometric proportion.

Figure 15C:
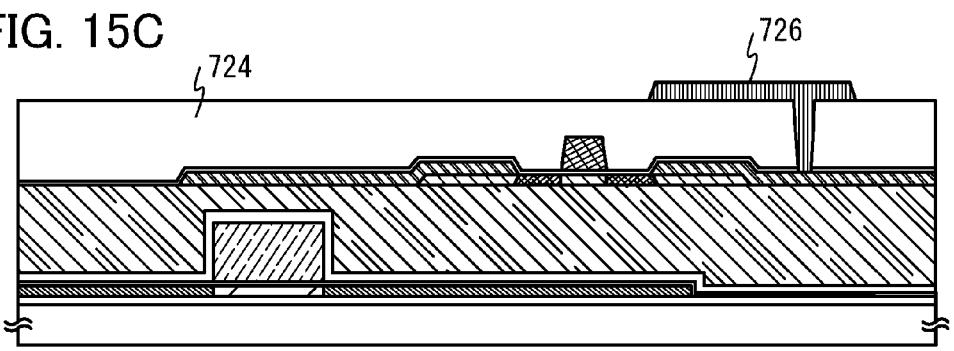

Next, as illustrated in FIG. 15C, an insulating film 724 is formed to cover the gate insulating film 721 and the gate electrode 722. The insulating film 724 can be formed by PVD, CVD, or the like. The insulating film 724 can be formed using a material including an inorganic insulating material such as silicon oxide, silicon oxynitride, silicon nitride, hafnium oxide, gallium oxide, or aluminum oxide. Note that for the insulating film 724, a material with a low dielectric constant or a structure with a low dielectric constant (e.g., a porous structure) is preferably used. When the dielectric constant of the insulating film 724 is lowered, parasitic capacitance generated between wirings or electrodes can be reduced, which results in higher speed operation. Although the insulating film 724 has a single-layer structure in this embodiment, one embodiment of the present invention is not limited to this structure. The insulating film 724 may have a layered structure of two or more layers.

Next, an opening is formed in the gate insulating film 721 and the insulating film 724, so that part of the conductive layer 720 is exposed. After that, a wiring 726 which is in contact with the conductive layer 720 through the opening is formed over the insulating film 724.

A conductive film is formed by PVD or CVD and then is etched so that the wiring 726 is formed. As the material of the conductive film, an element selected from aluminum, chromium, copper, tantalum, titanium, molybdenum, or tungsten; an alloy containing any of these elements as a component; or the like can be used. A material including one of manganese, magnesium, zirconium, beryllium, neodymium, and scandium or a combination of any of these elements may be used.

Specifically, for example, it is possible to employ a method in which a thin titanium film is formed in a region including the opening in the insulating film 724 by PVD and a thin titanium film (with a thickness of approximately 5 nm) is formed by PVD, and then an aluminum film is formed to be embedded in the opening. Here, the titanium film formed by PVD has a function of reducing an oxide film (e.g., a native oxide film) formed on a surface over which the titanium film is formed, to decrease the contact resistance with the lower electrode or the like (here, the conductive layer 720). In addition, hillocks of the aluminum film can be prevented. A copper film may be formed by a plating method after a barrier film of titanium, titanium nitride, or the like is formed.

Figure 15D:
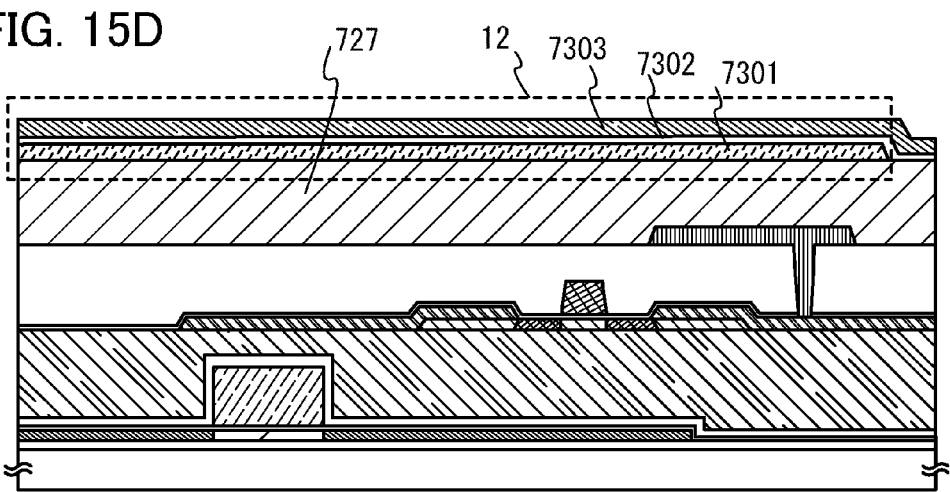

Next, as illustrated in FIG. 15D, an insulating film 727 is formed to cover the wiring 726. Further, a conductive film is formed over the insulating film 727 and is etched so that a conductive layer 7301 is formed. Then, an insulating film 7302 is formed to cover the conductive layer 7301, and a conductive film 7303 is formed over the insulating film 7302. Thus, the capacitor 12 can be formed. One of the pair of electrodes of the capacitor 12 corresponds to the conductive layer 7301. The other of the pair of electrodes of the capacitor 12 corresponds to the conductive film 7303. A dielectric layer of the capacitor 12 corresponds to the insulating film 7302. Here, the materials of the insulating film 727, the conductive layer 7301, the insulating film 7302, and the conductive film 7303 can be similar to the materials of other insulating films and other conductive layers.

Through the series of steps, the programmable LSI can be formed.

Through the above steps, the transistor 11 and the capacitor 12 in the nonvolatile storage circuit 10 included in the configuration memory 311 can overlap with the transistor 133 in the volatile storage circuit 200. Thus, the area of the configuration memory 311 can be reduced, so that the programmable LSI can be made small. Further, the nonvolatile storage circuit 10 and the volatile storage circuit 200 that are included in the configuration memory 311 can be electrically connected to each other easily.

This embodiment can be combined with any of the other embodiments as appropriate.

(Embodiment 7)

In this embodiment, the transistor 11 including an oxide semiconductor layer with a structure different from the structure in Embodiment 3 is described. Note that the same portions as those in FIGS. 15A to 15D are denoted by the same reference numerals, and description thereof is omitted.

Figure 16A:
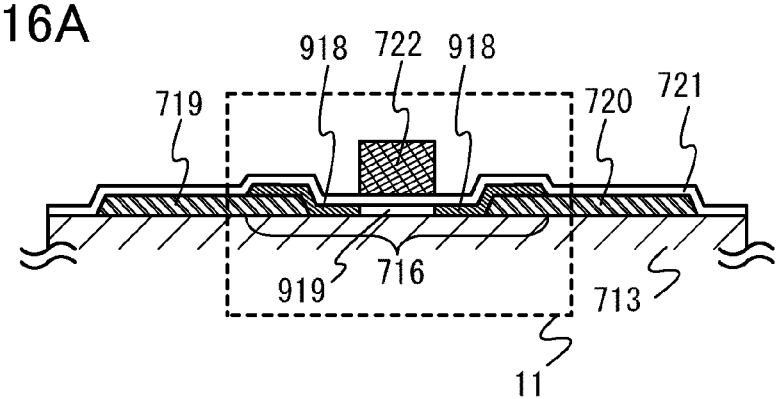
FIGS. 16A to 16C are cross-sectional views each illustrating the structure of a transistor whose channel is formed in an oxide semiconductor layer.

The transistor 11 in FIG. 16A is a top-gate transistor in which the gate electrode 722 is formed over the oxide semiconductor layer 716 and is also a bottom-contact transistor in which the source and drain electrodes (the conductive layers 719 and 720) are formed below the oxide semiconductor layer 716.

The oxide semiconductor layer 716 includes a pair of high-concentration regions 918 that can be obtained by addition of a dopant imparting n-type conductivity to the oxide semiconductor layer 716 after the formation of the gate electrode 722. In addition, in the oxide semiconductor layer 716, a region which overlaps with the gate electrode 722 with the gate insulating film 721 provided therebetween is a channel formation region 919. The oxide semiconductor layer 716 includes the channel formation region 919 between the pair of high-concentration regions 918.

The high-concentration regions 918 can be formed in a manner similar to that of the high-concentration regions 908 in Embodiment 6.

Figure 16B:
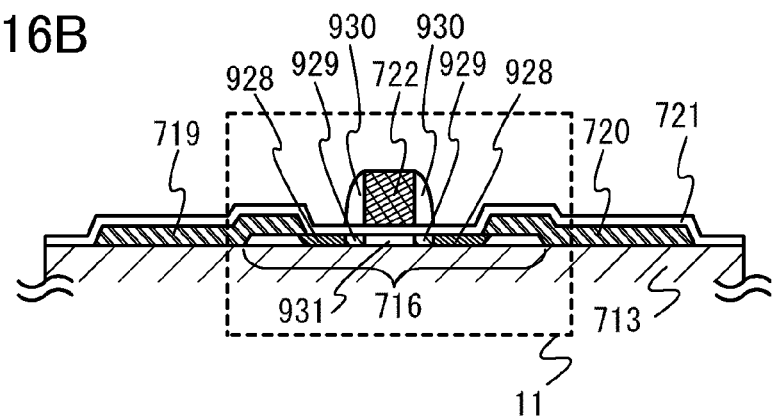

The transistor 11 in FIG. 16B is a top-gate transistor in which the gate electrode 722 is formed over the oxide semiconductor layer 716 and is also a top-contact transistor in which the source and drain electrodes (the conductive layers 719 and 720) are formed over the oxide semiconductor layer 716. The transistor 11 in FIG. 16B includes sidewalls 930 that are provided at ends of the gate electrode 722 and are formed using an insulating film.

The oxide semiconductor layer 716 includes a pair of high-concentration regions 928 and a pair of low-concentration regions 929 that can be obtained by addition of a dopant imparting n-type conductivity to the oxide semiconductor layer 716 after the formation of the gate electrode 722. In addition, in the oxide semiconductor layer 716, a region which overlaps with the gate electrode 722 with the gate insulating film 721 provided therebetween is a channel formation region 931. The oxide semiconductor layer 716 includes the pair of low-concentration regions 929 between the pair of high-concentration regions 928 and the channel formation region 931 between the pair of low-concentration regions 929. Further, the pair of low-concentration regions 929 is provided in a region of the oxide semiconductor layer 716 that overlaps with the sidewalls 930 with the gate insulating film 721 provided therebetween.

The high-concentration regions 928 and the low-concentration regions 929 can be formed in a manner similar to that of the high-concentration regions 908 in Embodiment 4.

Figure 16C:
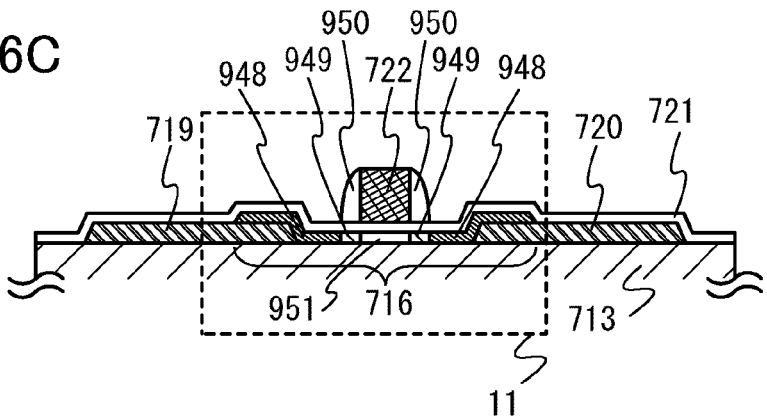

The transistor 11 in FIG. 16C is a top-gate transistor in which the gate electrode 722 is formed over the oxide semiconductor layer 716 and is also a bottom-contact transistor in which the source and drain electrodes (the conductive layers 719 and 720) are formed below the oxide semiconductor layer 716. The transistor 11 in FIG. 16C includes sidewalls 950 that are provided at ends of the gate electrode 722 and are formed using an insulating film.

The oxide semiconductor layer 716 includes a pair of high-concentration regions 948 and a pair of low-concentration regions 949 that can be obtained by addition of a dopant imparting n-type conductivity to the oxide semiconductor layer 716 after the formation of the gate electrode 722. In addition, in the oxide semiconductor layer 716, a region which overlaps with the gate electrode 722 with the gate insulating film 721 provided therebetween is a channel formation region 951. The oxide semiconductor layer 716 includes the pair of low-concentration regions 949 between the pair of high-concentration regions 948 and the channel formation region 951 between the pair of low-concentration regions 949. Further, the pair of low-concentration regions 949 is provided in a region of the oxide semiconductor layer 716 that overlaps with the sidewalls 950 with the gate insulating film 721 provided therebetween.

The high-concentration regions 948 and the low-concentration regions 949 can be formed in a manner similar to that of the high-concentration regions 908 in Embodiment 6.

Note that as one of methods for forming a high-concentration region functioning as a source region or a drain region in a transistor including an oxide semiconductor through a self-aligning process, a method has been disclosed by which a surface of an oxide semiconductor layer is exposed, argon plasma treatment is performed, and the resistance of a region in the oxide semiconductor layer that is exposed to plasma is lowered (S. Jeon et al., "180 nm Gate Length Amorphous InGaZnO Thin Film Transistor for High Density Image Sensor Applications", IEDM Tech. Dig., pp. 504-507, 2010).

However, in the formation method, it is necessary to remove a gate insulating film partly so that a region serving as a source region or a drain region is exposed after the formation of the gate insulating film. Thus, when the gate insulating film is removed, the oxide semiconductor layer that is the lower layer is over etched partly, so that the thickness of the region serving as the source region or the drain region is decreased. Consequently, the resistance of the source region or the drain region is increased and defects in characteristics of the transistor due to over etching easily occur.

In order to miniaturize the transistor, it is necessary to employ dry etching, which has high processing accuracy. The over etching particularly occurs easily in the case where dry etching, which cannot secure selectivity of the oxide semiconductor layer with respect to the gate insulating film sufficiently.

For example, over etching does not matter when the oxide semiconductor layer has sufficient large thickness. However, in the case where the channel length is 200 nm or less, it is necessary that the thickness of a region in the oxide semiconductor layer that serves as a channel formation region be 20 nm or less, preferably 10 nm or less in order to prevent a short channel effect. In the case where such a thin oxide semiconductor layer is used, the over etching of the oxide semiconductor layer is unfavorable because the resistance of the source region or the drain region is increased and defects in characteristics of the transistor occur as described above.

However, when a dopant is added to the oxide semiconductor layer while the oxide semiconductor layer is not exposed and the gate insulating film is left as in one embodiment of the present invention, the over etching of the oxide semiconductor layer can be prevented and excessive damage to the oxide semiconductor layer can be reduced. Further, an interface between the oxide semiconductor layer and the gate insulating film is kept clean. Thus, the characteristics and reliability of the transistor can be improved.

This embodiment can be combined with any of the other embodiments as appropriate.

(Embodiment 8)

In this embodiment, a transistor including an oxide semiconductor layer with a structure different from the structure in Embodiment 6 or Embodiment 7 is described. Note that the same portions as those in FIGS. 15A to 15D are denoted by the same reference numerals, and description thereof is omitted. In the transistor 11 in this embodiment, the gate electrode 722 is provided to overlap with the conductive layers 719 and 720. The transistor 11 in this embodiment differs from the transistor 11 in Embodiment 6 or Embodiment 7 in that an impurity element imparting conductivity is not added to the oxide semiconductor layer 716 with the use of the gate electrode 722 as a mask.

The transistor 11 in FIG. 17A includes the oxide semiconductor layer 716 below the conductive layers 719 and 720. The transistor 11 in FIG. 17B includes the oxide semiconductor layer 716 above the conductive layers 719 and 720. Note that FIGS. 17A and 17B each illustrate a structure in which a top surface of the insulating film 724 is not flattened; however, this embodiment is not limited to this structure. The top surface of the insulating film 724 may be flattened.

This embodiment can be combined with any of the other embodiments as appropriate.

(Embodiment 9)

A magnetic tunnel junction element (an MTJ element) is generally known as a nonvolatile random access memory. The MTJ element stores data in a low resistance state when the spin directions in films provided above and below with an insulating film provided therebetween are parallel, and stores data in a high resistance state when the spin directions are not parallel. On the other hand, the nonvolatile storage circuit in the above embodiment utilizes a transistor whose channel is formed in an oxide semiconductor layer. The principles of the MTJ element and the nonvolatile storage circuit in the above embodiment are completely different from each other. Table 1 shows comparison between the MTJ element (indicated by "spintronics (MTJ element)" in the table) and the nonvolatile storage circuit including an oxide semiconductor in the above embodiment (indicated by "OS/Si" in the table).

[Table 1]

The MTJ element is disadvantageous in that magnetic properties are lost when the temperature is the Curie temperature or higher because a magnetic material is used.

|  | Spintronics (MTJ element) | OS/Si |
|---|---|---|
| Heat Resistance | Curie temperature | Process temperature at 500° C. (reliability at 150° C.) |
| Driving Method | Current driving | Voltage driving |
| Writing Principle | Changing spin direction of magnetic body | Turning on/off FET |
| Si LSI | Suitable for bipolar LSI (MOS LSI is preferable for high integration because bipolar LSI is unsuitable for high integration. Note that W becomes larger.) | Suitable for MOS LSI |
| Overhead | Large (because of high Joule heat) | Smaller than overhead of the MTJ element by 2 to 3 or more orders of magnitude (because of charging and discharging of parasitic capacitance) |
| Nonvolatility | Utilizing spin | Utilizing low off-state current |
| Read Number | Without limitation | Without limitation |
| 3D Conversion | Difficult (at most two layers) | Easy (the number of layers is limitless) |
| Integration Degree (F.$^2$) | 4 to 15 F.$^2$ | Depends on the number of layers stacked in 3D conversion (it is necessary to ensure heat resistance in process of forming upper OS FET) |
| Material | Magnetic rare-earth element | OS material |
| Cost per Bit | High | Low (might be slightly high depending on OS material) |
| Resistance to Magnetic Field | Low | High |

Further, the MTJ element is compatible with a silicon bipolar device because current drive is employed. However, a silicon bipolar device is unsuitable for high integration. Furthermore, the MTJ element has a problem in that power consumption is increased by an increase in memory capacity, though the MTJ element consumes an extremely small amount of current during data writing.

In principle, the MTJ element has low resistance to a magnetic field, so that the spin direction is likely to change when the MTJ element is exposed to a high magnetic field. Further, it is necessary to control magnetic fluctuation due to nanoscaling of a magnetic body used for the MTJ element.

In addition, a rare earth element is used for the MTJ element; thus, it requires special attention to incorporate a process of forming the MTJ element in a process of forming a silicon semiconductor that avoids metal contamination. Further, the material cost per bit of the MTJ element is expensive.

On the other hand, the transistor whose channel is formed in the oxide semiconductor layer that is included in the nonvolatile storage circuit in the above embodiment has an element structure and an operation principle which are similar to those of a silicon MOSFET except that the region in which the channel is formed includes a metal oxide. Further, the transistor whose channel is formed in the oxide semiconductor layer is not affected by a magnetic field, and does not cause soft errors. This shows that the transistor is highly compatible with a silicon integrated circuit.

EXAMPLE 1

With the use of a semiconductor device including a programmable LSI according to one embodiment of the present invention, a low-power electronic device can be provided. In particular, in the case where a portable electronic device which has difficulty in receiving power at all times, an advantage of an increase in continuous operating time can be obtained when a low-power semiconductor device according to one embodiment of the present invention is added as a component of the device.

The semiconductor device including a programmable LSI according to one embodiment of the present invention can be used for display devices, personal computers, or image reproducing devices provided with recording media (typically, devices which reproduce the content of recording media such as digital versatile discs (DVDs) and have displays for displaying the reproduced images). Further, as an electronic device which can include the semiconductor device including a programmable LSI according to one embodiment of the present invention, cellular phones, game machines (including portable game machines), personal digital assistants, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given.

The case is described in which the semiconductor device including a programmable LSI according to one embodiment of the present invention is applied to a portable electronic device such as a cellular phone, a smartphone, or an e-book reader.

Figure 18:
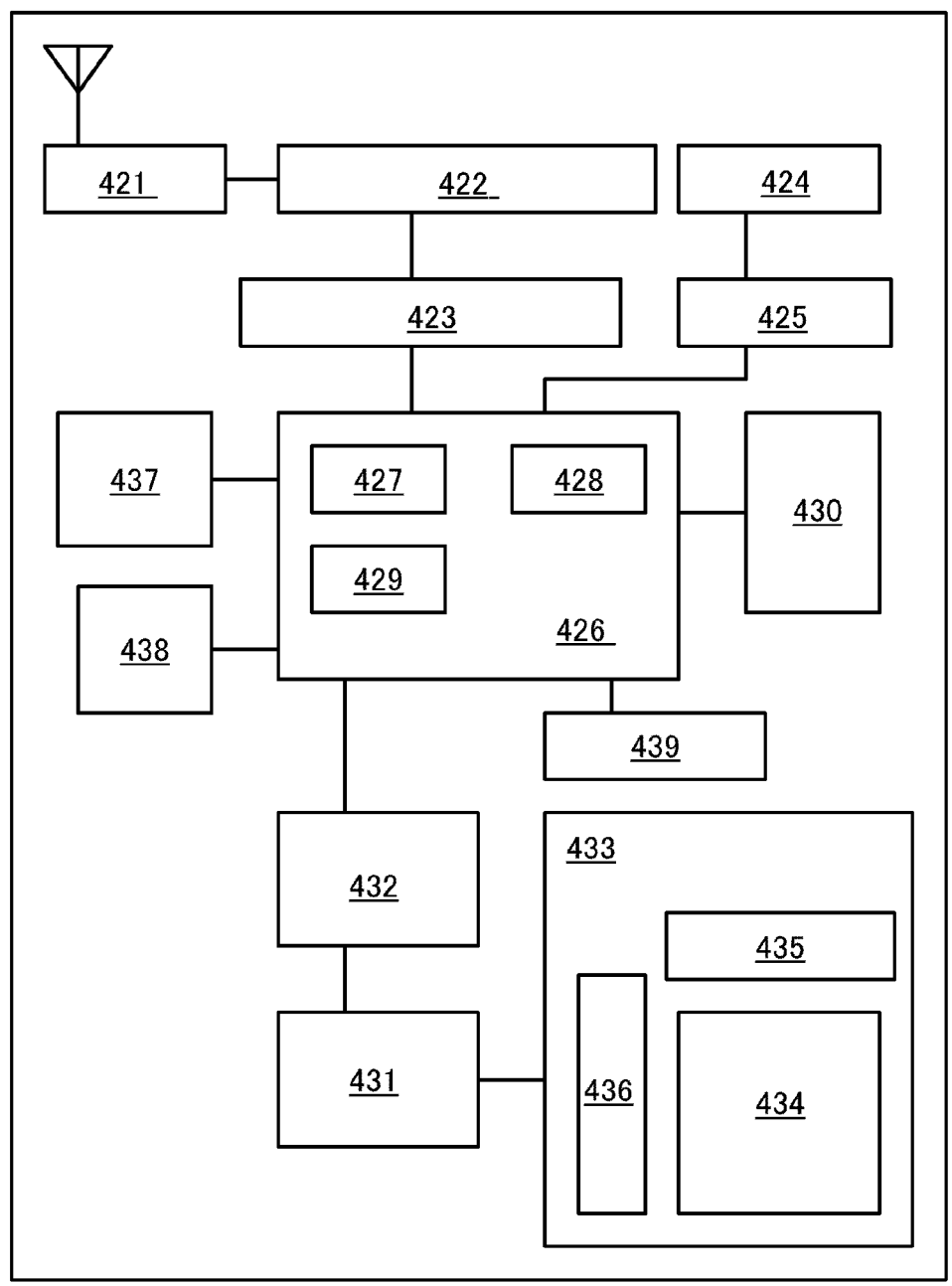
FIG. 18 is a block diagram of a portable electronic device.

FIG. 18 is a block diagram of a portable electronic device. The portable electronic device illustrated in FIG. 18 includes an RF circuit 421, an analog baseband circuit 422, a digital baseband circuit 423, a battery 424, a power supply circuit 425, an application processor 426, a flash memory 430, a display controller 431, a memory circuit 432, a display 433, a touch sensor 439, an audio circuit 437, a keyboard 438, and the like. The display 433 includes a display portion 434, a source driver 435, and a gate driver 436. The application processor 426 includes a CPU 427, a DSP 428, and an interface 429. For example, when the programmable LSI in the above embodiment is used as any or all of the CPU 427, the digital baseband circuit 423, the memory circuit 432, the DSP 428, the interface 429, the display controller 431, and the audio circuit 437, power consumption can be reduced.

Figure 19:
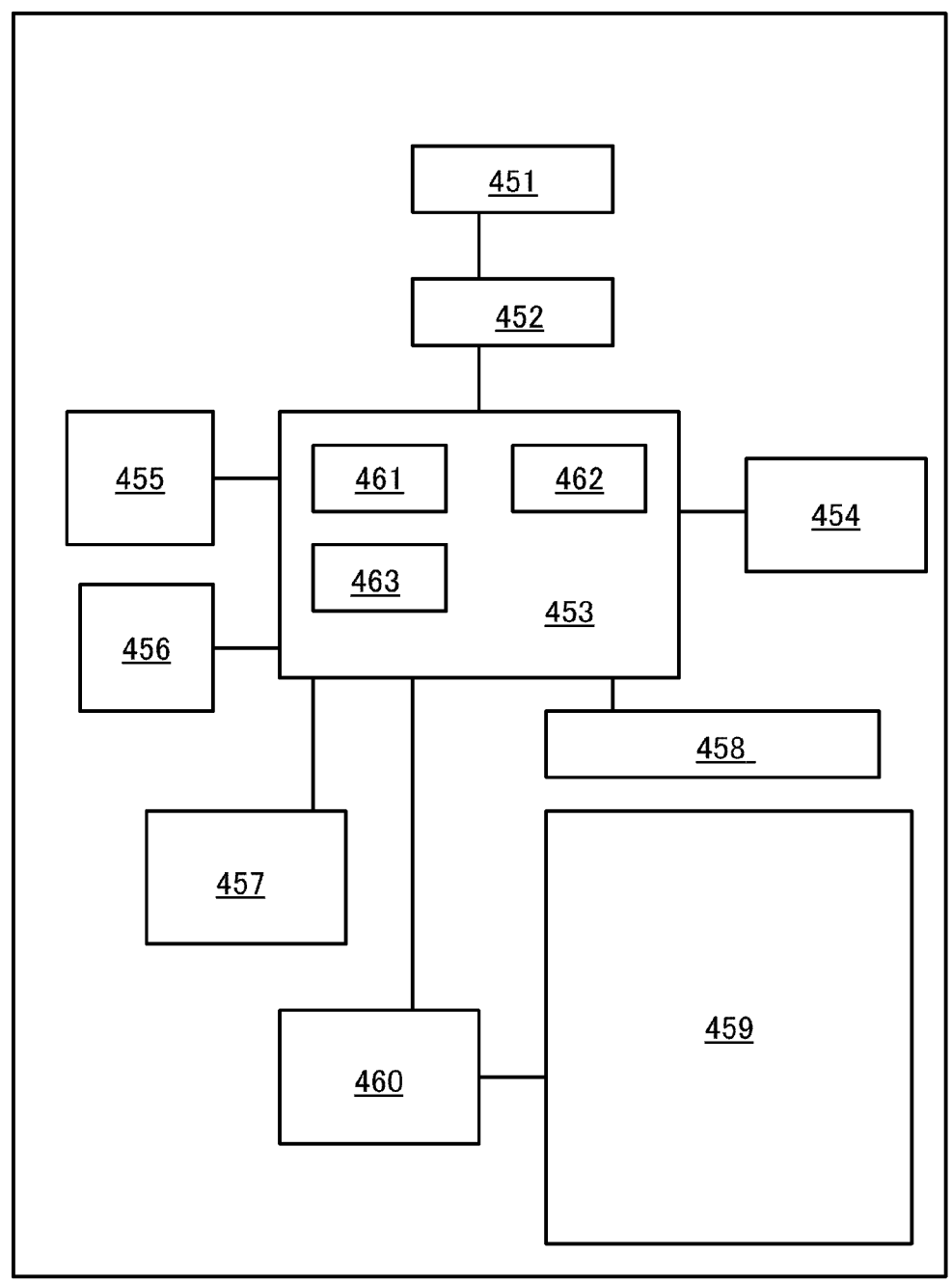
FIG. 19 is a block diagram of an e-book reader.

FIG. 19 is a block diagram of an e-book reader. The e-book reader includes a battery 451, a power supply circuit 452, a microprocessor 453, a flash memory 454, an audio circuit 455, a keyboard 456, a memory circuit 457, a touch panel 458, a display 459, and a display controller 460. The microprocessor 453 includes a CPU 461, a DSP 462, and an interface 463. For example, when the programmable LSI in the above embodiment is used as any or all of the CPU 461, the audio circuit 455, the memory circuit 457, the display controller 460, the DSP 462, and the interface 463, power consumption can be reduced.

This example can be combined with any of the above embodiments as appropriate.

This application is based on Japanese Patent Application serial No. 2011-088976 filed with Japan Patent Office on Apr. 13, 2011, the entire contents of which are hereby incorporated by reference.

What is claimed is:

1. A semiconductor device comprising:
   a programmable logic circuit comprising:
   a configuration memory comprising:
   a volatile storage circuit configured to store configuration data while a power source is supplied to the programmable logic circuit; and
   a nonvolatile storage circuit configured to store the configuration data while the power source is not supplied to the programmable logic circuit; and
   a memory element configured to store the configuration data,
   wherein at least part of the configuration data stored in the memory element is input to the configuration memory, and
   wherein the memory element comprises a transistor comprising an oxide semiconductor layer comprising a channel formation region, and a capacitor, one of a pair of electrodes of the capacitor being electrically connected to a node set in a floating state when the transistor is turned off.

2. The semiconductor device according to claim 1, wherein a function of the programmable logic circuit is changed in accordance with the configuration data.

3. The semiconductor device according to claim 1, wherein the nonvolatile storage circuit comprises a transistor configured to control storing of the configuration data, and
   wherein the transistor comprises an oxide semiconductor layer comprising a channel formation region.

4. The semiconductor device according to claim 3, wherein the nonvolatile storage circuit further comprises a capacitor, one of a pair of electrodes of the capacitor being electrically connected to a node set in a floating state when the transistor is turned off.

5. The semiconductor device according to claim 1, wherein the volatile storage circuit includes two arithmetic circuits, and
   wherein an output from one arithmetic circuit is input to the other arithmetic circuit, and an output from the other arithmetic circuit is input to the one arithmetic circuit.

6. A semiconductor device comprising:
   a programmable logic circuit comprising logic elements, each of the logic elements comprising:
   a configuration memory comprising:
   a volatile storage circuit configured to store configuration data; and
   a nonvolatile storage circuit configured to store the configuration data; and
   a memory element configured to store the configuration data,
   wherein at least part of the configuration data stored in the memory element is input to the configuration memory, and wherein the memory element comprises a transistor comprising an oxide semiconductor layer comprising a channel formation region, and a capacitor, one of a pair of electrodes of the capacitor being electrically connected to a node set in a floating state when the transistor is turned off.

7. The semiconductor device according to claim 6,
wherein a function of the programmable logic circuit is changed by changing an electrical connection between the logic elements in accordance with the configuration data.

8. The semiconductor device according to claim 6,
wherein the nonvolatile storage circuit comprises a transistor configured to control storing of the configuration data, and
wherein the transistor comprises an oxide semiconductor layer comprising a channel formation region.

9. The semiconductor device according to claim 8, wherein the nonvolatile storage circuit further comprises a capacitor, one of a pair of electrodes of the capacitor being electrically connected to a node set in a floating state when the transistor is turned off.

10. The semiconductor device according to claim 6,
wherein the volatile storage circuit includes two arithmetic circuits, and
wherein an output from one arithmetic circuit is input to the other arithmetic circuit, and an output from the other arithmetic circuit is input to the one arithmetic circuit.

11. A semiconductor device comprising:
a programmable logic circuit comprising logic elements, each of the logic elements comprising:
a configuration memory;
a volatile storage circuit configured to store configuration data; and
a nonvolatile storage circuit configured to store the configuration data;
a look-up table configured to perform different arithmetic processing in accordance with the configuration data; and
a selection circuit configured to change an electrical connection between the logic elements in accordance with the configuration data; and
a memory element configured to store the configuration data,
wherein at least part of the configuration data stored in the memory element is input to the configuration memory, and
wherein the memory element comprises a transistor comprising an oxide semiconductor layer comprising a channel formation region, and a capacitor, one of a pair of electrodes of the capacitor being electrically connected to a node set in a floating state when the transistor is turned off.

12. The semiconductor device according to claim 11, wherein each of the logic elements further comprises a register output a signal corresponding to an output signal from the look-up table in synchronization with a clock signal.

13. The semiconductor device according to claim 11,
wherein the nonvolatile storage circuit comprises a transistor configured to control storing of the configuration data, and
wherein the transistor comprises an oxide semiconductor layer comprising a channel formation region.

14. The semiconductor device according to claim 13, wherein the nonvolatile storage circuit further comprises a capacitor, one of a pair of electrodes of the capacitor being electrically connected to a node set in a floating state when the transistor is turned off.

15. The semiconductor device according to claim 11,
wherein the volatile storage circuit includes two arithmetic circuits, and
wherein an output from one arithmetic circuit is input to the other arithmetic circuit, and an output from the other arithmetic circuit is input to the one arithmetic circuit.

* * * * *